(12) United States Patent
Laurent et al.

(10) Patent No.: US 10,591,828 B2
(45) Date of Patent: Mar. 17, 2020

(54) LITHOGRAPHIC APPARATUS AND METHOD

(71) Applicant: ASML NETHERLANDS B.V., Veldhoven (NL)

(72) Inventors: Thibault Simon Mathieu Laurent, Eindhoven (NL); Gerardus Adrianus Antonius Maria Kusters, Eindhoven (NL); Bastiaan Andreas Wilhelmus Hubertus Knarren, Nederweert-Eind (NL); Raymond Wilhelmus Louis Lafarre, Helmond (NL); Koen Steffens, Veldhoven (NL); Takeshi Kaneko, 's Hertogenbosch (NL); Robbert Jan Voogd, Neerpelt (BE); Gregory Martin Mason Corcoran, Eindhoven (NL); Ruud Hendrikus Martinus Johannes Bloks, Helmond (NL); Johan Gertrudis Cornelis Kunnen, Weert (NL); Ramin Badie, Eindhoven (NL)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/270,958

(22) Filed: Feb. 8, 2019

(65) Prior Publication Data

US 2019/0171113 A1   Jun. 6, 2019

Related U.S. Application Data

(63) Continuation of application No. 15/818,232, filed on Nov. 20, 2017, now Pat. No. 10,203,611, which is a
(Continued)

(51) Int. Cl.
*G03F 7/20* (2006.01)

(52) U.S. Cl.
CPC .......... *G03F 7/70483* (2013.01); *G03F 7/707* (2013.01); *G03F 7/70341* (2013.01);
(Continued)

(58) Field of Classification Search
CPC ............. G03F 7/70341; G03F 7/70691; G03F 7/70716
See application file for complete search history.

(56) References Cited

U.S. PATENT DOCUMENTS

| 4,509,852 A | 4/1985 | Tabarelli et al. |
| 7,256,871 B2 | 8/2007 | Loopstra et al. |
| (Continued) | | |

FOREIGN PATENT DOCUMENTS

| EP | 1 420 300 | 5/2004 |
| JP | 10-116771 | 5/1998 |
| (Continued) | | |

*Primary Examiner* — Steven Whitesell Gordon
(74) *Attorney, Agent, or Firm* — Pillsbury Winthrop Shaw Pittman, LLP

(57) ABSTRACT

A substrate table to support a substrate on a substrate supporting area, the substrate table having a heat transfer fluid channel at least under the substrate supporting area, and a plurality of heaters and/or coolers to thermally control the heat transfer fluid in the channel at a location under the substrate supporting area.

20 Claims, 12 Drawing Sheets

Related U.S. Application Data continuation of application No. 15/078,814, filed on Mar. 23, 2016, now Pat. No. 9,823,589, which is a continuation of application No. 13/183,220, filed on Jul. 14, 2011, now Pat. No. 9,298,107.

(60) Provisional application No. 61/417,097, filed on Nov. 24, 2010, provisional application No. 61/384,663, filed on Sep. 20, 2010, provisional application No. 61/365,268, filed on Jul. 16, 2010.

(52) U.S. Cl.
CPC ...... *G03F 7/70716* (2013.01); *G03F 7/70775* (2013.01); *G03F 7/70875* (2013.01)

(56) References Cited

U.S. PATENT DOCUMENTS

| | | |
|---|---|---|
| 7,304,715 B2 | 12/2007 | Cadee et al. |
| 7,589,820 B2 | 9/2009 | Nei et al. |
| 7,649,611 B2 | 1/2010 | Zaal et al. |
| 8,134,688 B2 | 3/2012 | Shibazaki |
| 9,298,107 B2 | 3/2016 | Laurent |
| 9,823,589 B2 | 11/2017 | Laurent |
| 2004/0136494 A1 | 7/2004 | Lof et al. |
| 2004/0207824 A1 | 10/2004 | Lof et al. |
| 2005/0219488 A1 | 10/2005 | Nei |
| 2006/0023178 A1 | 2/2006 | Loopstra et al. |
| 2006/0023194 A1 | 2/2006 | Loopstra et al. |
| 2006/0033892 A1 | 2/2006 | Cadee et al. |
| 2006/0033898 A1 | 2/2006 | Cadee et al. |
| 2006/0087637 A1 | 4/2006 | Ottens et al. |
| 2006/0119809 A1 | 6/2006 | Verhagen et al. |
| 2006/0285093 A1 | 12/2006 | Hara et al. |
| 2007/0153244 A1 | 7/2007 | Zaal et al. |
| 2007/0263191 A1 | 11/2007 | Shibazaki |
| 2007/0288121 A1 | 12/2007 | Shibazaki |
| 2008/0043212 A1 | 2/2008 | Shibazaki |
| 2008/0049209 A1 | 2/2008 | Nagasaka et al. |
| 2008/0094592 A1 | 4/2008 | Shibazaki |
| 2008/0094593 A1* | 4/2008 | Shibazaki ........... G03F 7/70725 355/53 |
| 2008/0106707 A1 | 5/2008 | Kobayashi et al. |
| 2008/0137005 A1 | 6/2008 | Kim |
| 2008/0137055 A1 | 6/2008 | Hennus et al. |
| 2008/0143981 A1 | 6/2008 | Ehm et al. |
| 2008/0291413 A1 | 11/2008 | Steijaert et al. |
| 2009/0002649 A1 | 1/2009 | Iwasaki |
| 2009/0033900 A1 | 2/2009 | Kanaya |
| 2009/0059194 A1 | 3/2009 | Kanaya |
| 2009/0135382 A1* | 5/2009 | Kida ............... G03F 7/70341 355/30 |
| 2009/0206304 A1 | 8/2009 | Dziomkina |
| 2009/0231561 A1 | 9/2009 | Arai |
| 2009/0262175 A1 | 10/2009 | Kim et al. |
| 2009/0279061 A1* | 11/2009 | Jacobs ............... G03F 7/70341 355/30 |
| 2010/0045949 A1 | 2/2010 | Nakano et al. |
| 2010/0134769 A1 | 6/2010 | Mulkens et al. |
| 2011/0199601 A1 | 8/2011 | Kaneko |
| 2011/0222032 A1 | 9/2011 | Ten Kate et al. |
| 2011/0222033 A1 | 9/2011 | Ten Kate et al. |

FOREIGN PATENT DOCUMENTS

| | | |
|---|---|---|
| JP | 2008-141086 | 6/2008 |
| JP | 2009-252988 | 10/2009 |
| JP | 2009-272631 | 11/2009 |
| JP | 2010-087212 | 4/2010 |
| JP | 2010-109270 | 5/2010 |
| JP | 2010-153840 | 7/2010 |
| WO | 99/49504 | 9/1999 |
| WO | 2005/064405 | 7/2005 |
| WO | 2009/013905 | 1/2009 |
| WO | 2009/078443 | 6/2009 |
| WO | 2010-071239 | 6/2010 |
| WO | 2010-118902 | 10/2010 |

* cited by examiner

LITHOGRAPHIC APPARATUS AND METHOD

This application is a continuation of U.S. patent application Ser. No. 15/818,232, filed November 2017, now allowed, which is a continuation of U.S. patent application Ser. No. 15/078,814, filed on Mar. 23, 2016, now U.S. Pat. No. 9,823,589, which is a continuation of U.S. patent application Ser. No. 13/183,220, filed on Jul. 14, 2011, now U.S. Pat. No. 9,298,107, which claims priority and benefit under 35 U.S.C. § 119(e) to U.S. Provisional Patent Application No. 61/365,268, filed on Jul. 16, 2010, to U.S. Provisional Patent Application No. 61/384,663, filed on Sep. 20, 2010, and to U.S. Provisional Patent Application No. 61/417,097, filed on Nov. 24, 2010. The content of each of the foregoing applications is incorporated herein in its entirety by reference.

FIELD

The present invention relates to a lithographic apparatus and a method of compensating thermal variation.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

It has been proposed to immerse the substrate in the lithographic projection apparatus in a liquid having a relatively high refractive index, e.g. water, so as to fill a space between the final element of the projection system and the substrate. In an embodiment, the liquid is distilled water, although another liquid can be used. An embodiment of the present invention will be described with reference to liquid. However, another fluid may be suitable, particularly a wetting fluid, an incompressible fluid and/or a fluid with higher refractive index than air, desirably a higher refractive index than water. Fluids excluding gases are particularly desirable. The point of this is to enable imaging of smaller features since the exposure radiation will have a shorter wavelength in the liquid. (The effect of the liquid may also be regarded as increasing the effective numerical aperture (NA) of the system and also increasing the depth of focus.) Other immersion liquids have been proposed, including water with solid particles (e.g. quartz) suspended therein, or a liquid with a nano-particle suspension (e.g. particles with a maximum dimension of up to 10 nm). The suspended particles may or may not have a similar or the same refractive index as the liquid in which they are suspended. Other liquids which may be suitable include a hydrocarbon, such as an aromatic, a fluorohydrocarbon, and/or an aqueous solution.

Submersing the substrate or substrate and substrate table in a bath of liquid (see, for example U.S. Pat. No. 4,509,852) means that there is a large body of liquid that must be accelerated during a scanning exposure. This requires additional or more powerful motors and turbulence in the liquid may lead to undesirable and unpredictable effects.

In an immersion apparatus, immersion fluid is handled by a fluid handling system, structure or apparatus. In an embodiment the fluid handling system may supply immersion fluid and therefore be a fluid supply system. In an embodiment the fluid handling system may at least partly confine immersion fluid and thereby be a fluid confinement system. In an embodiment the fluid handling system may provide a barrier to immersion fluid and thereby be a barrier member, such as a fluid confinement structure. In an embodiment the fluid handling system may create or use a flow of gas, for example to help in controlling the flow and/or the position of the immersion fluid. The flow of gas may form a seal to confine the immersion fluid so the fluid handling structure may be referred to as a seal member; such a seal member may be a fluid confinement structure. In an embodiment, immersion liquid is used as the immersion fluid. In that case the fluid handling system may be a liquid handling system. In reference to the aforementioned description, reference in this paragraph to a feature defined with respect to fluid may be understood to include a feature defined with respect to liquid.

One of the arrangements proposed is for a liquid supply system to provide liquid on only a localized area of the substrate and in between the final element of the projection system and the substrate using a liquid confinement system (the substrate generally has a larger surface area than the final element of the projection system). One way which has been proposed to arrange for this is disclosed in PCT patent application publication no. WO 99/49504. As illustrated in FIGS. 2 and 3, liquid is supplied by at least one inlet onto the substrate W, preferably along the direction of movement of the substrate W relative to the final element, and is removed by at least one outlet after having passed under the projection system PS. That is, as the substrate W is scanned beneath the element in a −X direction, liquid is supplied at the +X side of the element and taken up at the −X side. FIG. 2 shows the arrangement schematically in which liquid is supplied via inlet and is taken up on the other side of the element by outlet which is connected to a low pressure source. In the illustration of FIG. 2 the liquid is supplied along the direction of movement of the substrate W relative to the final element, though this does not need to be the case. Various orientations and numbers of in- and out-lets positioned around the final element are possible, one example is illustrated in FIG. 3 in which four sets of an inlet with an outlet on either side are provided in a regular pattern around the final element. Note that arrows in FIGS. 2 and 3 show liquid flow.

A further immersion lithography solution with a localized liquid supply system is shown in FIG. 4. Liquid is supplied by two groove inlets on either side of the projection system PS and is removed by a plurality of discrete outlets arranged radially outwardly of the inlets IN. The inlets and can be arranged in a plate with a hole in its center and through which the projection beam is projected. Liquid is supplied by one groove inlet on one side of the projection system PS and removed by a plurality of discrete outlets on the other side of the projection system PS, causing a flow of a thin film of liquid between the projection system PS and the substrate W. The choice of which combination of inlet and outlets to use can depend on the direction of movement of the substrate W (the other combination of inlet and outlets being inactive). Note that arrows in FIG. 4 show liquid flow.

In European patent application publication no. EP 1420300 and U.S. patent application publication no. 2004-0136494, the idea of a twin or dual stage immersion lithography apparatus is disclosed. Such an apparatus is provided with two tables for supporting a substrate. Leveling measurements are carried out with a table at a first position, without immersion liquid, and exposure is carried out with a table at a second position, where immersion liquid is present. Alternatively, the apparatus has only one table.

PCT patent application publication WO 2005/064405 discloses an all wet arrangement in which the immersion liquid is unconfined. In such a system the whole top surface of the substrate is covered in liquid. This may be advantageous because then the whole top surface of the substrate is exposed to the substantially same conditions. This has an advantage for temperature control and processing of the substrate. In WO 2005/064405, a liquid supply system provides liquid to the gap between the final element of the projection system and the substrate. That liquid is allowed to leak over the remainder of the substrate. A barrier at the edge of a substrate table prevents the liquid from escaping so that it can be removed from the top surface of the substrate table in a controlled way. Although such a system improves temperature control and processing of the substrate, evaporation of the immersion liquid may still occur. One way of helping to alleviate that problem is described in U.S. patent application publication no. 2006/0119809. A member is provided which covers the substrate in all positions and which is arranged to have immersion liquid extending between it and the top surface of the substrate and/or substrate table which holds the substrate.

SUMMARY

In an immersion lithographic apparatus, a liquid (e.g., water) is present between projection system and the substrate (e.g., wafer) to improve imaging performance. The presence of liquid can lead to an additional thermal load (e.g., a cooling load) compared to a non-immersion "dry" system. Such a thermal load may be applied directly on the substrate (e.g., a thermal load from a liquid supply system near the substrate, a thermal load due to evaporation of liquid on the substrate, etc) and/or may mainly affect the substrate table (e.g., the substrate table edge adjacent the substrate when the substrate is held in a recess in the substrate table). In order to have good performance (mainly overlay and focus), it is desirable to have a substrate table that can reduce or eliminate the effects of such a thermal load in order to avoid deformation (e.g., expansion or contraction) of the substrate and/or substrate table.

Thus, it is desirable, for example, to provide an apparatus in which the occurrence of thermal expansion/contraction effects are reduced or eliminated. In particular it is desirable to provide a system configured to reduce thermal expansion/contraction effects in an immersion system which uses a liquid supply system which provides immersion fluid to the substrate and/or substrate table.

According to an aspect of the invention, there is provided a substrate table to support a substrate on a substrate supporting area, the substrate table comprising a heat transfer fluid channel under at least a part of the substrate supporting area, and at least one heater and/or cooler at a location under the substrate supporting area to control thermally the heat transfer fluid in the channel.

According to an aspect of the invention, there is provided an immersion lithographic projection apparatus comprising the substrate table described herein.

According to an aspect of the invention, there is provided a method of compensating for a local heat load in a lithographic projection apparatus comprising a substrate table configured to support a substrate on a substrate supporting area, the method comprising controlling at least one heater and/or cooler at a location under the substrate supporting area to thermally control a heat transfer fluid in a heat transfer fluid channel under at least the substrate supporting area.

According to an aspect of the invention, there is provided a lithographic apparatus comprising a substrate table to hold a substrate; a reference frame; a grating; and a sensor, wherein the grating is attached to one of the substrate table and reference frame and the sensor is attached to the other of the substrate table and reference frame, the sensor is configured to detect radiation diffracted and/or reflected by the grating so as to measure a relative position between the substrate table and the reference frame, and the substrate table and/or reference frame comprises a heat transfer fluid channel over or under the grating and/or the sensor to control thermally the grating and/or the sensor.

According to an aspect of the invention, there is provided a lithographic apparatus comprising: a reference frame and/or a substrate table to hold a substrate; a grating attached to one of the substrate table and reference frame, wherein the grating is configured to diffract and/or reflect radiation detected to measure a relative position between the substrate table and the reference frame; an optically transparent plate to cover at least a part of a surface of the grating; and a vacuum pump to maintain a gap between the grating and the plate at a pressure lower than an ambient pressure so as to hold the plate in position.

According to an aspect of the invention, there is provided a lithographic apparatus comprising: a substrate table to hold a substrate on a substrate supporting area; and a grating or sensor attached to the substrate table, wherein the grating or sensor is a part of a positional system, wherein the substrate table comprises a heat transfer fluid channel under the substrate supporting area and adjacent the grating or sensor, so as to control thermally the temperature of the substrate supporting area and the grating or sensor.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
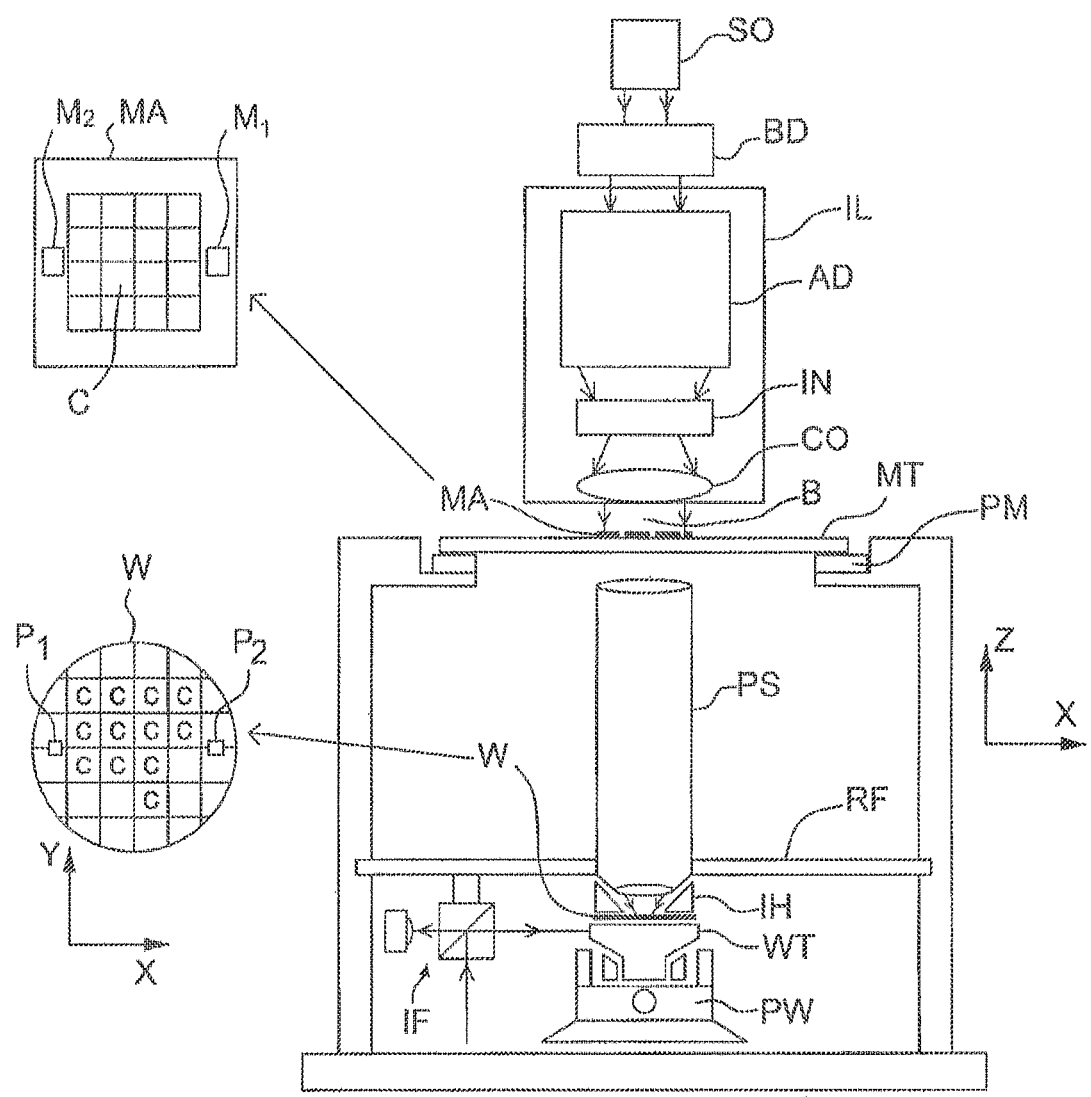
FIG. 1 schematically depicts a lithographic apparatus.
Figure 2:
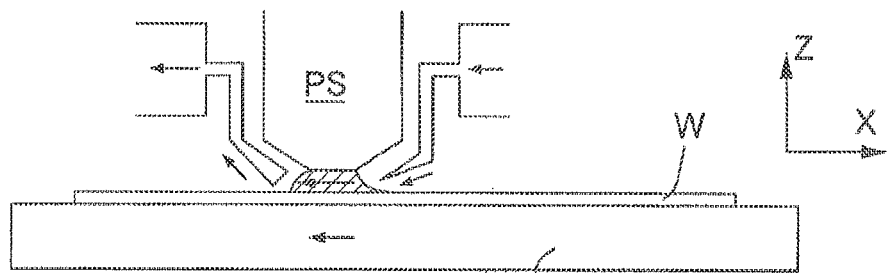
FIGS. 2 and 3 depict a liquid supply system for use in a lithographic projection apparatus.
Figure 3:
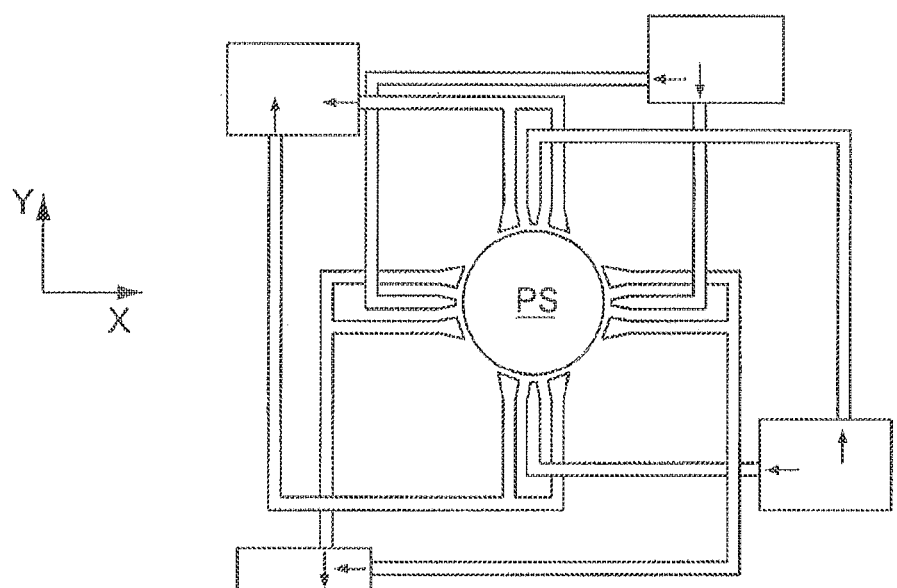
Figure 4:
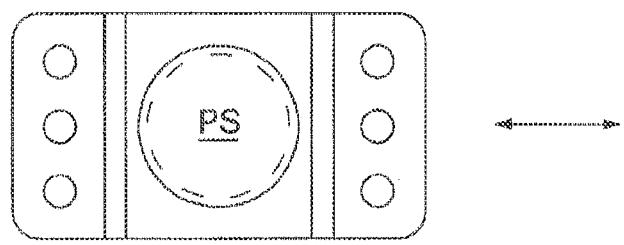
FIG. 4 depicts a further liquid supply system for use in a lithographic projection apparatus.
Figure 4:
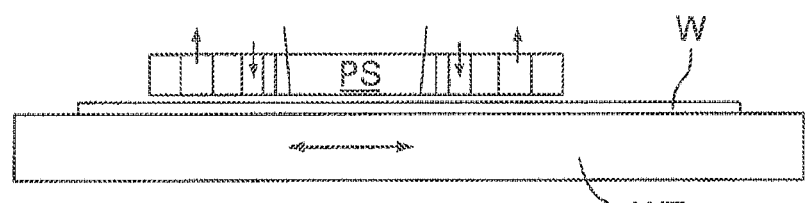

FIG. 1 schematically depicts a lithographic apparatus according to one embodiment of the invention. The apparatus comprises:

an illumination system (illuminator) IL configured to condition a radiation beam B (e.g. UV radiation or DUV radiation);

a support structure (e.g. a mask table) MT constructed to support a patterning device (e.g. a mask) MA and connected to a first positioner PM configured to accurately position the patterning device MA in accordance with certain parameters;

a substrate table (e.g. a wafer table) WT constructed to hold a substrate (e.g. a resist-coated wafer) W and connected to a second positioner PW configured to accurately position the substrate W in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system IL may include various types of optical components, such as refractive, reflective, magnetic, electromagnetic, electrostatic or other types of optical components, or any combination thereof, for directing, shaping, or controlling radiation.

The support structure MT holds the patterning device MA. The support structure MT holds the patterning device MA in a manner that depends on the orientation of the patterning device MA, the design of the lithographic apparatus, and other conditions, such as for example whether or not the patterning device MA is held in a vacuum environment. The support structure MT can use mechanical, vacuum, electrostatic or other clamping techniques to hold the patterning device MA. The support structure MT may be a frame or a table, for example, which may be fixed or movable as required. The support structure MT may ensure that the patterning device MA is at a desired position, for example with respect to the projection system PS. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device MA may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator IL can be adjusted. In addition, the illuminator IL may comprise various other components, such as an integrator IN and a condenser CO. The illuminator IL may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device MA. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WT can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam B is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam B is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion C in a single dynamic exposure, whereas the length of the scanning motion determines the height (in the scanning direction) of the target portion C.

3. In another mode, the support structure MT is kept essentially stationary holding a programmable patterning device, and the substrate table WT is moved or scanned while a pattern imparted to the radiation beam B is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Arrangements for providing liquid between a final element of the projection system PS and the substrate can be classed into two general categories. These are the bath type arrangement in which the whole of the substrate W and optionally part of the substrate table WT is submersed in a bath of liquid and the so called localized immersion system which uses a liquid supply system in which liquid is only provided to a localized area of the substrate. In the latter category, the space filled by liquid is smaller in plan than the top surface of the substrate and the area filled with liquid remains substantially stationary relative to the projection system PS while the substrate W moves underneath that area. A further arrangement is the all wet solution in which the liquid is unconfined. In this arrangement substantially the whole top surface of the substrate and all or part of the substrate table is covered in immersion liquid. The depth of the liquid covering at least the substrate is small. The liquid may be a film, such as a thin film, of liquid on the substrate. Any of the liquid supply devices of FIGS. 2-5 may be used in such a system; however, sealing features are not present, are not activated, are not as efficient as normal or are otherwise ineffective to seal liquid to only the localized area. Four different types of localized liquid supply systems are illustrated in FIGS. 2-5. The liquid supply systems disclosed in FIGS. 2-4 were described above.

Figure 5:
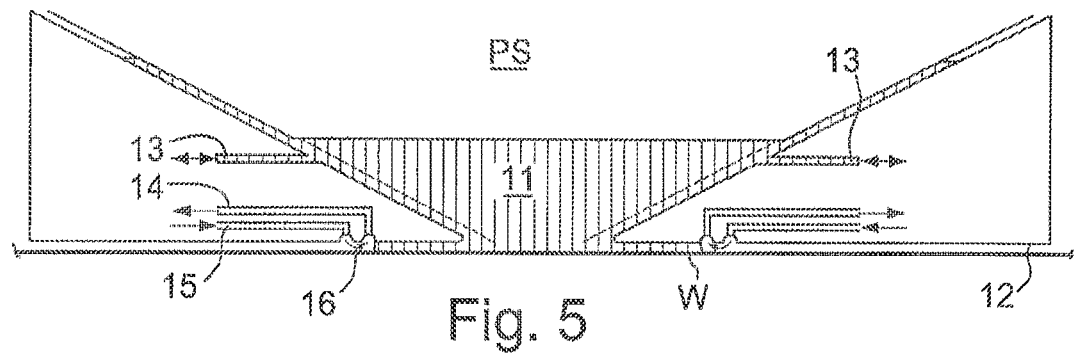
FIG. 5 depicts, in cross-section, a fluid confinement structure which may be used in a liquid supply system.

Another arrangement which has been proposed is to provide the liquid supply system with a liquid confinement member which extends along at least a part of a boundary of the space between the final element of the projection system and the substrate table. Such an arrangement is illustrated in FIG. 5. The liquid confinement member is substantially stationary relative to the projection system in the XY plane though there may be some relative movement in the Z direction (in the direction of the optical axis). A seal is formed between the liquid confinement and the surface of the substrate. In an embodiment, a seal is formed between the liquid confinement structure and the surface of the substrate and may be a contactless seal such as a gas seal. Such a system is disclosed in U.S. patent application publication no. 2004-0207824.

FIG. 5 schematically depicts a localized liquid supply system with a fluid confinement structure 12, IH. The fluid confinement structure 12 extends along at least a part of a boundary of the space 11 between the final element of the projection system PS and the substrate table WT or substrate W. (Please note that reference in the following text to surface of the substrate W also refers in addition or in the alternative to a surface of the substrate table W, unless expressly stated otherwise.) The fluid confinement structure 12 is substantially stationary relative to the projection system PS in the XY plane though there may be some relative movement in the Z direction (in the direction of the optical axis). In an embodiment, a seal is formed between the fluid confinement structure 12 and the surface of the substrate W and may be a contactless seal such as a fluid seal, desirably a gas seal.

The fluid confinement structure 12 at least partly contains liquid in the space 11 between a final element of the projection system PS and the substrate W. A contactless seal, such as a gas seal 16, to the substrate W may be formed around the image field of the projection system PS so that liquid is confined within the space 11 between the substrate W surface and the final element of the projection system PS. The space 11 is at least partly formed by the fluid confinement structure 12 positioned below and surrounding the final element of the projection system PS. Liquid is brought into the space 11 below the projection system PS and within the fluid confinement structure 12 by liquid inlet 13. The liquid may be removed by liquid outlet 13. The fluid confinement structure 12 may extend a little above the final element of the projection system PS. The liquid level rises above the final element so that a buffer of liquid is provided. In an embodiment, the fluid confinement structure 12 has an inner periphery that at the upper end closely conforms to the shape of the projection system PS or the final element thereof and may, e.g., be round. At the bottom, the inner periphery closely conforms to the shape of the image field, e.g., rectangular, though this need not be the case.

In an embodiment, the liquid is contained in the space 11 by the gas seal 16 which, during use, is formed between the bottom of the fluid confinement structure 12 and the surface of the substrate W. The gas seal 16 is formed by gas, e.g. air or synthetic air but, in an embodiment, $N_2$ or another inert gas. The gas in the gas seal 16 is provided under pressure via inlet 15 to the gap between fluid confinement structure 12 and substrate W. The gas is extracted via outlet 14. The overpressure on the gas inlet 15, vacuum level on the outlet 14 and geometry of the gap are arranged so that there is a high-velocity gas flow inwardly that confines the liquid. The force of the gas on the liquid between the fluid confinement structure 12 and the substrate W contains the liquid in a space 11. The inlets/outlets may be annular grooves which surround the space 11. The annular grooves may be continuous or discontinuous. The flow of gas is effective to contain the liquid in the space 11. Such a system is disclosed in U.S. patent application publication no. 2004-0207824.

Other arrangements are possible and, as will be clear from the description below, an embodiment of the present invention may be use with any type of liquid supply system.

Figure 6:
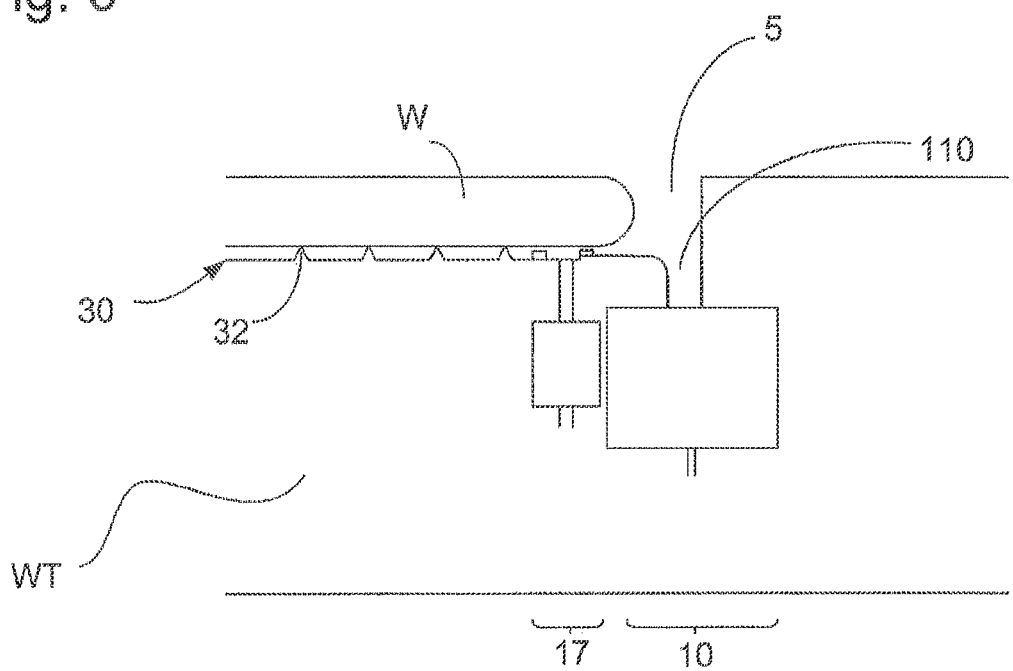
FIG. 6 illustrates, in cross-section, a portion of a substrate table surrounding the edge of a substrate.

In an immersion lithographic apparatus, a substrate is often positioned in a recess within the substrate table. In order to account for variations in the width (e.g., diameter) of the substrate, the recess is usually made a little larger than the maximum likely size of the substrate. Therefore there exists a gap between the edge of the substrate and the substrate table. FIG. 6 is a schematic cross-section through a substrate table WT and a substrate W of such an arrangement. A gap 5 exists between an edge of the substrate W and an edge of the substrate table WT. The gap 5 is at an outer area or edge of a recess in which the substrate W is placed during imaging. The substrate W can be supported on a substrate supporting area of the substrate table WT. In an immersion lithography machine using a localized area liquid supply system, when the edge of the substrate W is being imaged (or at other times such as when the substrate W first moves under the projection system PS, as described above), a gap 5 between the edge of the substrate W and the edge of the substrate table WT will pass under, for example, the space 11 filled with liquid by the liquid supply system 12. This can result in liquid from the space 11 entering the gap 5. In other liquid supply systems, liquid can enter the gap 5 at any time.

In order to deal with the liquid entering that gap 5, at least one drain 10, 17 may be provided at the edge of the substrate W to remove liquid which enters the gap 5. In the embodiment of FIG. 6, two drains 10, 17 are illustrated though there may be only one drain or there could be more than two drains. The drains 10, 17 are, for example, annular so that the whole periphery of the substrate W is surrounded.

The primary function of the first drain 10 is to prevent bubbles of gas from entering the liquid 11 of the liquid supply system 12. Any such bubbles can deleteriously affect the imaging of the substrate W. The second drain 17 may be provided to prevent any liquid which finds its way from the gap 5 to underneath the substrate W. Such liquid underneath the substrate W may, for example, prevent efficient release of the substrate W from the substrate table WT after imaging. As is conventional, the substrate W is held by a pimple table 30 comprising a plurality of projections 32. An underpressure applied between the substrate W and the substrate table WT by the pimple table 30 ensures that the substrate W is held firmly in place. However, if liquid gets between the substrate W and the pimple table 30, this can lead to difficulties, particularly when unloading the substrate W. The provision of the second drain 17 under the pimple table 30 reduces or eliminates problems which may occur due to liquid finding its way underneath the substrate W. The first drain 10 may comprise an inlet 110 (which may be a continuous groove or a plurality of individual through holes) which puts a chamber into fluid communication with the gap 5.

When liquid is supplied to the space between the projection system PS and the substrate table WT, liquid may come into contact with a number of structures of the lithographic apparatus including, for example, the substrate W and substrate table WT. Often, the liquid may evaporate. The evaporation of liquid leads to localized cooling. Localized cooling can result in mechanical contractions of the substrate W and/or substrate table WT, which in turn may lead to overlay errors. As an example, the drawing of gas and/or liquid through the inlet 110 can lead to the evaporation of liquid which has entered the gap 5 and/or is on the substrate W. As another example, the movement of the substrate W relative to a liquid supply system 12 during exposures can lead to residual liquid on the substrate W and/or substrate table WT, which residual liquid may evaporate.

One way in which this phenomenon of localized cooling may be dealt with is to provide a channel for a heat transfer fluid (e.g., heat transfer liquid) in the substrate table WT. The temperature of the substrate table can be maintained substantially constant in this way. Additionally, as disclosed in U.S. Publication No. 2008-0137055, a further thermal control device (e.g., a heater and/or cooler) may be used to control the temperature of the substrate table and/or substrate in the vicinity of the gap. Therefore the particular thermal load which is generated at or near the gap may be compensated for by the use of that further thermal control device.

Figure 7:
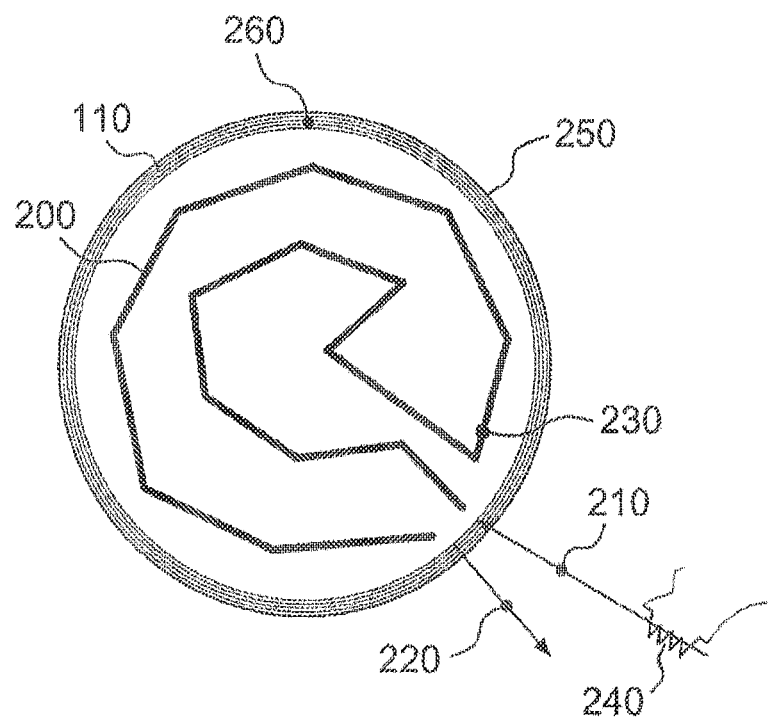
FIG. 7 illustrates, in plan, a substrate table.

FIG. 7 illustrates one such arrangement. FIG. 7 is a plan view of the substrate support area of a substrate table WT. The inlet 110 is indicated. A central channel 200 for heat transfer fluid is provided. The central channel 200 follows a path under the position of the substrate W. The path of the central channel 200 is such that an even heating and/or cooling can be applied by passing a heat transfer fluid through the channel 200. The temperature of the heat transfer fluid entering the channel 200 is detected by a first temperature sensor 210. The temperature of heat transfer fluid exiting the channel 200 is detected by a second temperature sensor 220. A third temperature sensor 230 may be provided in the channel 200 to detect the temperature at a local point. A controller can be provided with data from the temperature sensors 210, 220, 230 and can control the temperature of the heat transfer fluid using a heater/cooler 240 which is used to control the heat transfer fluid prior to the heat transfer fluid entering the channel 200.

In order to, for example, deal with the excessive cooling which can be generated by the first drain 10, a thermal control element 250 (e.g., a heater) may be provided. In an embodiment, the thermal control element 250 may be a single element which is adjacent the inlet 110 and extends around the periphery (e.g., circumference) of the inlet 110. In an embodiment, the thermal control element 250 may extend around the periphery of the pimple table 30 at a location close to the edge of the substrate W when held on the substrate table WT. In an embodiment, the pimple table 30 closely conforms in size to, for example, a 200 or 300 mm wafer. The thermal control element 250 may be positioned underneath the chamber 140 or on either side of the chamber 140, as illustrated in FIG. 6. There may be other appropriate positions for the thermal control element 250.

A fourth temperature sensor 260 may be provided. The fourth temperature sensor 260 is provided in the vicinity of the inlet 110. A controller 261 can use the information obtained from the fourth temperature sensor 260 to control the power applied to the thermal control element 250.

Figure 8:
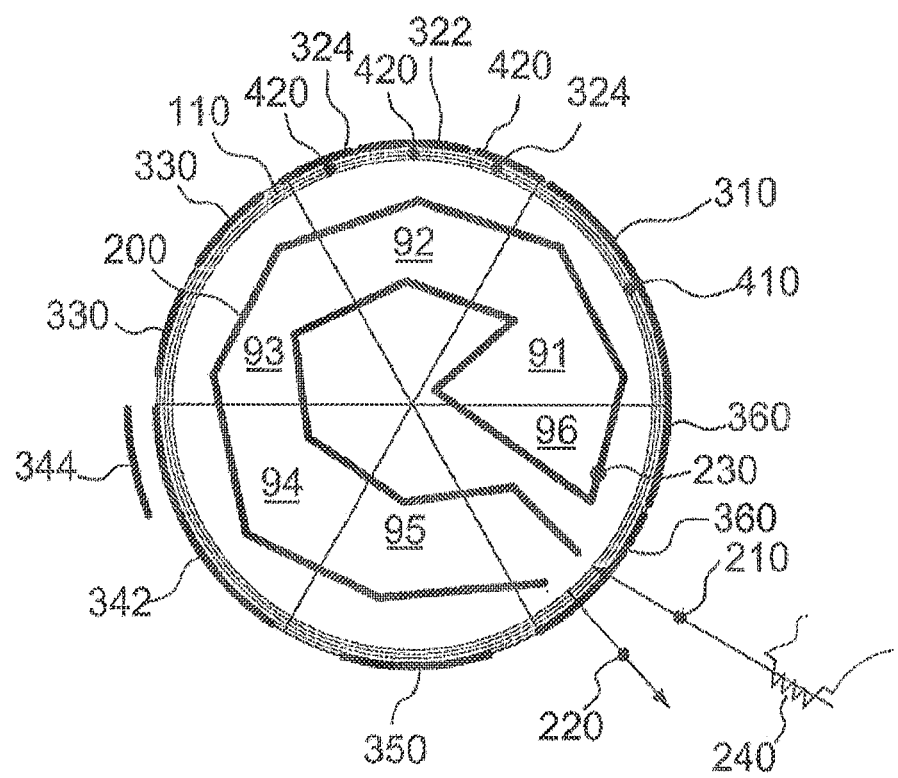
FIG. 8 illustrates, in plan, a further substrate table.

FIG. 8 illustrates a further substrate table WT. A plurality of thermal control elements 310, 322, 324, 330, 342, 344, 350, 360 similar to thermal control element 250 are provided. At least two of the plurality of thermal control elements 310, 322, 324, 330, 342, 344, 350, 360 are positioned along different segments of an edge of the substrate supporting area. That is, the periphery of the inlet 110 and/or pimple table 30 is segmented and each segment has at least one thermal control element 310, 322, 324, 330, 342, 344, 350, 360 associated with it. This can be seen most clearly with reference to FIG. 8 which illustrates in plan the substrate support area just like in FIG. 7. In contrast to FIG. 7, instead of providing a single thermal control element 250 around the entire periphery, the periphery has been split into six sections or segments. Each section or segment is provided with at least one thermal control element 310, 322, 324, 330, 342, 344, 350, 360. In FIG. 8 for illustration purposes each section is provided with a different combination of thermal control elements 310, 322, 324, 330, 342, 344, 350, 360. However, it will be appreciated that any combination of thermal control elements may be used and indeed all of the sections may have the same thermal control element configuration or only some of the sections may have the same thermal control element configuration.

In the first segment 91, only a single thermal control element 310 is present. In the second segment 92 three thermal control elements 322, 324 are illustrated. In the third segment 93, two thermal control elements 330 are provided.

In the fourth segment 94, a thermal control element 342 covers the entire length of the segment 94. In FIG. 8 the fifth segment 95 has a single thermal control element 350 which does not extend along the whole length of the segment 95. In the sixth segment 96, two thermal control elements 360 are present which, contrary to what is the case in the third segment 93, do extend along the entire length of the segment 96.

As can be seen, the thermal control elements, as a group, extend substantially around the edge of the substrate supporting area, even though there may be gaps between neighboring thermal control elements. At least two thermal control elements will be non-parallel and this helps ensure that not just portions on opposite sides of the edge of the substrate supporting area have associated thermal control elements (as in, for example, the arrangement of parallel thermal control elements in U.S. Pat. No. 7,304,715).

Each of the thermal control elements are shaped closely to conform, in plan, to the portion of the edge of the substrate supporting area with which they are associated, that is, the thermal control elements are not, in plan, straight, they are curved (where the substrate is curved). Each of the thermal control elements may be elongate in the vertical or horizontal direction as well as elongate peripherally as illustrated in FIG. 8. Any combination of horizontal and vertical thermal control element(s) and/or number of thermal control element(s) and/or location may be used in each segment.

In an embodiment, the plurality of thermal control elements are individually controllable in the sense that at least two of the plurality of thermal control elements are independently controllable of one another. However, it may be the case that two thermal control elements in the same segment are controlled in unison. For example, in the third and sixth segments 93, 96 of FIG. 8, the thermal control elements 330, 360 may be controlled in the same way.

In an embodiment, the control of the thermal control elements is done based on results of temperature sensors positioned within the segment. As can be seen in FIG. 8, each segment may be provided with a single sensor 410 as is illustrated in the first segment 91. Alternatively or additionally, more than one temperature sensor may be provided per segment. One such example is illustrated in the second segment 92 where there are three temperature sensors 420 positioned along the length of the segment 92. The precise position of the temperature sensors can vary, particularly the height of the temperature sensor within the substrate table and its radial location relative to the components of the first drain 10 and/or the pimple table 30.

By providing the plurality of thermal control elements which are individually controllable, it is possible to account for local thermal variations. For example, if the inlet 110 passes under a localized liquid supply system, cooling is only likely to occur along a length of the inlet 110 which passes under the area covered by liquid. With the system of FIG. 8 it is possible to thermally control only that area and so maintain a more constant temperature of the substrate table WT and thereby reduce overlay errors. By providing the thermal control elements in groups of segments, it is possible to carefully control the local temperature.

A controller 201 may be provided to control the thermal power applied by the channel 200 and each of the thermal control elements. The controller may base the amount of power supplied to the channel 200 and/or each thermal control element 310, 322, 324, 330, 342, 344, 350, 360 on signals received from one or more temperature sensors. Alternatively or additionally, the thermal power applied by the channel 200 and/or the thermal control elements may be based on the position of the substrate table WT under the liquid handling system. Therefore, for example, when the position of the substrate table WT indicates that a thermal load may be applied at a certain location, a thermal control element at that location may be energized to compensate. The controller 201 may be in the form of computer software. The controller 201 may control a plurality of thermal control elements of a single segment as a group or it may control those thermal control elements individually.

The controller 201 attempts to maintain the measured temperature at a given set point. The faster the response the better the performance which can be expected. The faster the thermal time constants, the smaller the net maximum temperature change which will occur on the application of a heat load. The controller 201 may control the channel 200 and/or thermal control elements based on feedback from temperature sensors in at the thermal control elements as well as optionally at least one of sensors 220, 230, 260. Feed forward control is possible based on the position of the liquid handling system 12.

The temperature sensors discussed above may be on or in the material of the substrate table WT. For example, the temperature sensors may be positioned at a joint between two such parts thereby to be embedded in the substrate table WT though that is not necessarily the case. Embedding the temperature sensor may provide much better thermal response than positioning a sensor in a channel 200. The temperature sensors could be point sensors in which case it is likely that more than one temperature sensor per segment will be needed. For any particular arrangement, the thermal response may be better if the response is controlled by the signal from three temperature sensors in a segment rather than just one temperature sensor. An average of the sensors should be taken. The sensors may be connected in parallel or in series but this does not really affect their performance. Either way will give an average of the temperature measurement. Alternatively the temperature sensors could be a ribbon sensor which by its nature averages the temperature over an area. The sensor could, for example, be a NTC sensor (that is a negative temperature co-efficient sensor) which is surface mounted.

The position of the channel 200 and thermal control elements 250, 310, 322, 324, 330, 342, 344, 350, 360 is chosen according to the exact design of the substrate table. For example, it may be known that one particular part of the substrate and/or substrate table experiences a higher heat load than other areas. In that case, for example, the channel 200 and/or a thermal control element 250, 310, 322, 324, 330, 342, 344, 350, 360 can be located close to that area.

Figure 9:
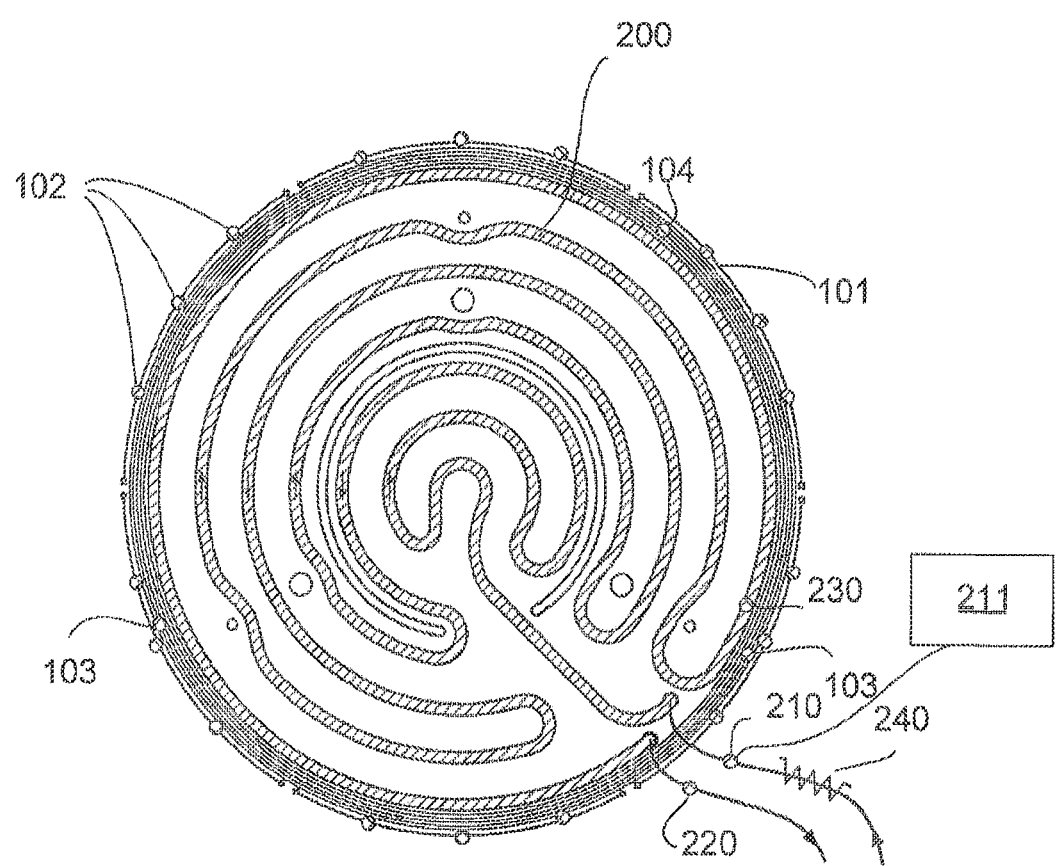
FIG. 9 illustrates, in plan, a further substrate table.

FIG. 9 is a plan view of the substrate support area of a substrate table WT similar to that depicted in FIGS. 7 and 8. A central channel 200 for heat transfer fluid is provided. The central channel 200 follows a path under the position of the substrate W. The temperature of the heat transfer fluid entering the channel 200 is detected by a first temperature sensor 210. The temperature of heat transfer fluid exiting the channel 200 is detected by a second temperature sensor 220. A third temperature sensor 230 may be provided in the channel 200 to detect the temperature at a local point. A controller 211 can be provided with data from the temperature sensors 210, 220, 230 and can control the temperature of the heat transfer fluid using a heater/cooler 240 which is used to control the heat transfer fluid prior to the heat transfer fluid entering the channel 200.

A plurality of thermal control elements 101 (e.g., heaters or coolers) are provided. Each of these thermal control elements is similar to thermal control element 310 in FIG. 8, i.e., each extends around a portion of the periphery. While six thermal control elements are shown, another number or arrangement may be provided.

Further, a plurality of temperature sensor systems 102 are provided. Each of these temperature sensor systems is similar to the three temperature sensors 420 provided for segment 92 in FIG. 8. In an embodiment, each temperature sensor system has three temperature sensors 102 although a different number may be provided. A controller 105 can use the information obtained from the various temperature sensors 102 to control the thermal load applied by the channel 200 and/or the thermal control elements 101.

At least one first drain temperature sensor 103 may be provided under the first drain 10. At least one second drain temperature sensor 104 may be provided under the second drain 17.

In this arrangement, the thermal control elements 101 have a fast response time (e.g., in the order of 3-5 seconds). This is possible, for example, because the temperatures sensors 102 for the thermal control elements 101 are very close to those elements and/or because the thermal control elements 101 can change their applied thermal load quickly.

On the contrary, the channel 200 has a quite slow response time (e.g., in the order of 15-20 seconds). This is because the heater/cooler 240 can be located quite far from the channel 200 portion under the substrate W. For example, the heater/cooler 240 may be located on a portion of the substrate stage separate and less thermally controlled than the substrate table WT. So, after heat has been transferred between the heater/cooler 240 and the heat transfer fluid, the heat transfer fluid takes time to reach the channel 200 portion under the substrate W and then further takes time to travel through the substrate table WT to reach all the temperature sensors 220, 230. While the temperature sensor position could be changed, this may not be optimal since the sensors 220, 230 should be "downstream" of the thermal load acting on the substrate W and/or substrate table WT in order for the temperature sensor to "see" it but not too close to the gap between the substrate W and the substrate table WT in order not to be disturbed by the greater thermal load likely at that location.

The long response time discussed above can have a drawback. For example, a system with a long response time is more difficult to control. The amplitude of temperature is larger with a slow system. Additionally or alternatively, slow control may be detrimental to high substrate exposure throughput. The time needed to expose a substrate is in the same order of magnitude as the time constant of the heater/cooler control. This means that thermal disturbance during a substrate cycle may have an effect on the following substrate. Additionally or alternatively, control of a quite large surface area (e.g., the substrate supporting area) with a single heater/cooler can be lead to quite large temperature gradients over the surface.

Figure 10:
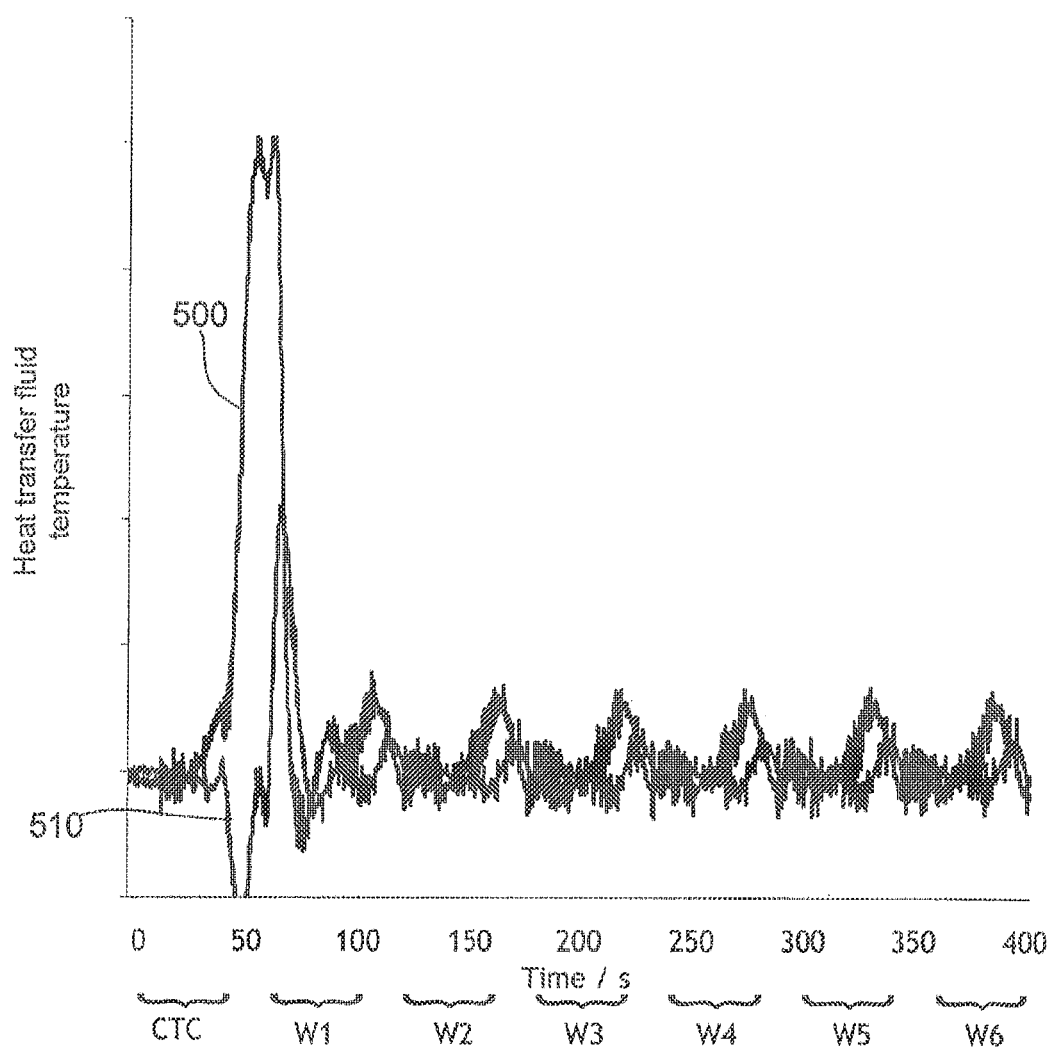
FIG. 10 depicts a graph showing experimental performance of a substrate table.

An illustration is provided of the large temperature gradient drawback as well as the effect on following substrate drawback. Referring to FIG. 10, a bare substrate was experimentally tested as a closing substrate for a liquid supply system 12 of an immersion lithographic apparatus. With a bare substrate, the residual liquid on the substrate from the liquid supply system is more than with a typical production substrate and so more evaporation was likely to occur. Referring to FIG. 10, the gradient over the substrate table increases when the load increases—compare the line 500 representing the temperature of the heat transfer fluid entering the substrate table WT (e.g., sensor 210) with the line 510 representing the temperature inside the substrate table WT (e.g., sensor 230). This gradient is very large with the first test or thermally conditioning substrate (CTC substrate) but continues with subsequent substrates W. The temperature inside the substrate table (e.g., sensor 230) is normally controlled at a target temperature, over different substrates. Within a run of substrates, the first substrate suffers from what happened to the CTC substrate in FIG. 10—a noticeable gradient occurs. These effects would likely adversely affect overlay.

Figure 11:
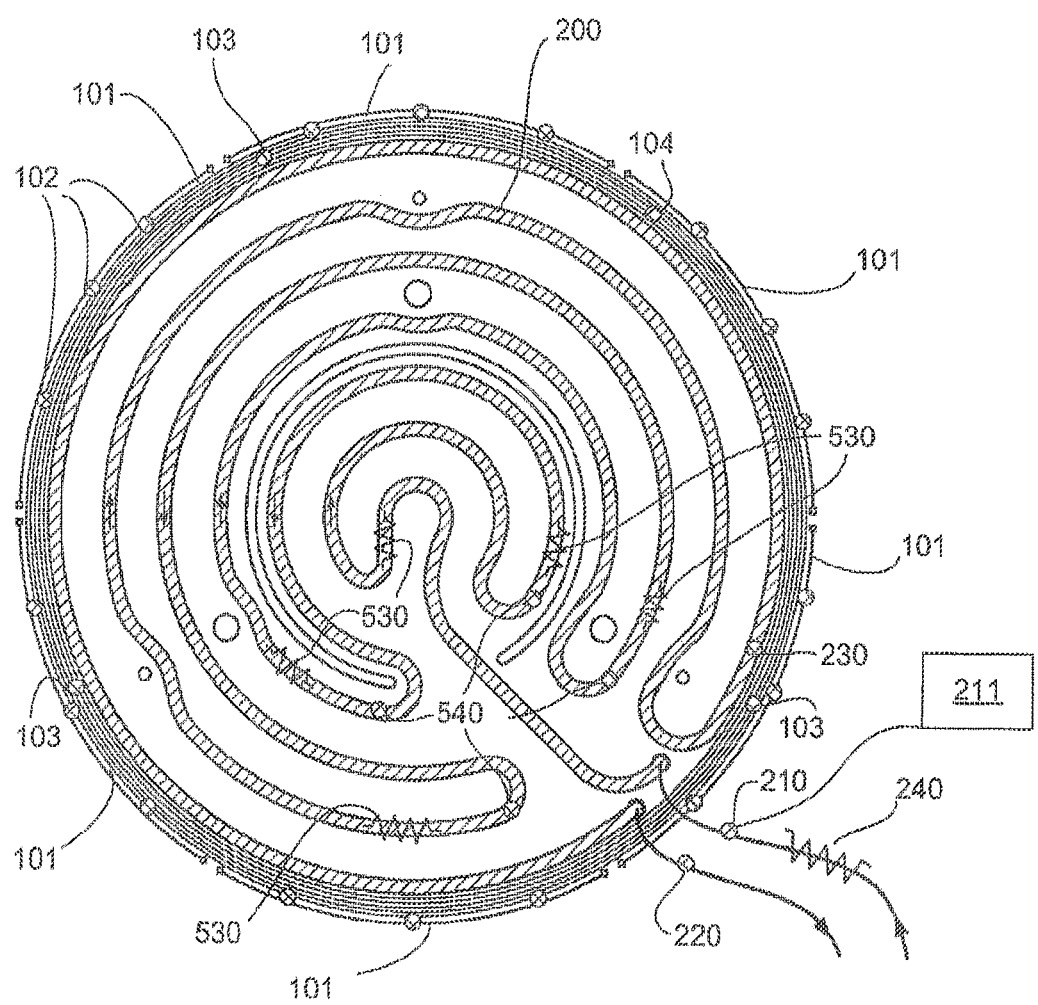
FIG. 11 illustrates, in plan, a substrate table according to an embodiment of the invention.

FIG. 11 depicts an embodiment of the invention. The substrate table WT comprises the heat transfer fluid channel 200 under at least a part of the substrate supporting area. The heat transfer fluid channel 200 may be in the pimple table 30 of the substrate table WT, or may be in another section of the substrate table WT. At least one heater and/or cooler 530 is provided at a location under the substrate supporting area.

The heater and/or cooler 530 is provided to control thermally the heat transfer fluid in the heat transfer fluid channel 200. The heater and/or cooler 530 is in addition to the heater/cooler 240 which is used to control the heat transfer fluid prior to the heat transfer fluid entering the channel 200. The heater/cooler 240 is not under the substrate supporting area, whereas the heater and/or cooler 530 is under the substrate supporting area. In an embodiment, the heater/cooler 240 is not present.

The purpose of the heater and/or cooler 530 under the substrate supporting area is to control the temperature of the heat transfer fluid in the heat transfer fluid channel 200 accurately. The temperature of the heat transfer fluid under the substrate supporting area can be changed more quickly compared to the substrate table WT depicted in FIG. 9 that has a heat transfer fluid channel 200 without any heater or cooler at a location under the substrate supporting area.

Furthermore, by having at least the heater/cooler 240 to control the temperature of the heat transfer fluid prior to the heat transfer fluid entering the channel 200 and the heater and/or cooler 530 to control the temperature of the heat transfer fluid in the channel 200, the temperature gradient of the heat transfer fluid in the channel 200 is reduced compared to a channel 200 that has only a heater/cooler 240 to control the temperature of fluid prior to the fluid entering the channel 200.

The heater and/or cooler 530 may be inside the channel 200. The heater and/or cooler 530 may be disposed on an inner surface of the channel 200. Additionally or alternatively the heater and/or cooler 530 may be disposed on an outer surface of the channel 200, or may be embedded within the substrate table WT distal from the channel 200.

In accordance with an embodiment of the invention, referring to FIG. 11, a plurality of heaters and/or coolers 530 may be provided to thermally condition the heat transfer fluid in the channel 200 at various locations under the substrate supporting area, thereby controlling the temperature of the substrate table WT.

Further, a plurality of temperature sensors 540 may be provided to implement the thermal control. Each of the plurality of temperature sensors 540 may be associated with each of the heaters and/or coolers 530. For example, each heater and/or cooler 530 is controlled by a temperature sensor 540 downstream therefrom. While a particular arrangement of heaters/coolers 530 and sensors 540 is shown in FIG. 11, other designs with different numbers and/or locations of sensors and heaters/coolers may be used. The plurality of temperature sensors 540 may include the third temperature sensor 230 described above in relation to the construction depicted in FIG. 9.

In an embodiment, the heater and/or cooler 530 is controlled according to readings from at least one of the temperature sensors 540. For example, it may be desirable to maintain the temperature of the substrate supporting area at a target value. If the controller 211 reads a measurement from temperature sensor 210 that the temperature of the heat transfer fluid in the channel 200 is less than the target value, then the controller 211 controls the heater and/or cooler 530 to raise the temperature of the heat transfer fluid. If the controller 211 reads a measurement from the temperature sensor 540 that the temperature of the heat transfer fluid in the channel 200 is greater than the target value, then the controller 211 controls the heater and/or cooler 530 to reduce the temperature of the heat transfer fluid. In this way, the heater and/or cooler 530 is paired to at least one of the temperature sensors 540.

Desirably, within a pair comprising a heater and/or cooler 530 and a temperature sensor 540, the temperature sensor 540 is downstream of the heater and/or cooler 530. The purpose of this is that the heater and/or cooler 530 changes the temperature of the heat transfer fluid that subsequently flows to the temperature sensor 540. In this way, the heater and/or cooler 530 and the temperature sensor 540 form a feedback loop.

In an embodiment, the substrate table WT is provided with a plurality of such pairs, wherein each pair comprises a heater and/or cooler 530 and a temperature sensor 540. The pairs may be positioned sequentially along the channel 200 such that the heater and/or cooler 530 of a downstream pair is downstream of the temperature sensor 540 of an upstream pair. Each pair may comprise a controller 211. Alternatively, the controller 211 may be common to (i.e. shared by) a plurality of pairs.

In an embodiment, the pairs overlap such that the temperature sensor 540 of an upstream pair is downstream of the heater and/or cooler 530 of a downstream pair. Whether the pairs are arranged sequentially, or overlapping, the channel distance between the temperature sensor of one pair and the heater and/or cooler 530 of a downstream pair is less than the channel distance between that temperature sensor 540 and the heater and/or cooler 530 of the same pair. The purpose of this is to allow sufficient channel distance between the heater and/or cooler 530 and the temperature sensor 540 of a pair so as to reduce the number of pairs used to control the temperature of the heat transfer fluid in the channel 200 sufficiently accurately, while reducing or minimizing the channel distance between sequential pairs (or even effectively a negative distance in the case of the overlapping configuration). The purpose of this is to keep to reduce or minimize regions of heat transfer fluid that are outside of the feedback loops of the pairs.

The temperature sensor 540 and the heater and/or cooler 530 of adjacent pairs are very close to each other. In an embodiment, the controller 211 controls the heater and/or cooler 530 of a downstream pair according to measurements read from the temperature sensor 540 of an upstream pair (i.e. the heater and/or cooler 530 and the temperature sensor 540 that are close to each other). The purpose of this is to allow the temperature in one particular portion of the channel 200 (i.e. where the temperature sensor 540 is positioned) to be controlled accurately and very rapidly. This form of control can allow more rapid control of the temperature at that position because of the decreased distance between the temperature sensor 540 and the heater and/or cooler 530. This form of control may be particularly effective in the case of the overlapping pairs configuration.

The channel 200 may follow a tortuous path. The tortuous path may comprise a series of hairpin bends. In an embodiment, the temperature sensor 540 and the heater and/or cooler 530 are positioned immediately downstream of a hairpin bend.

In an embodiment, the heater and/or cooler 530 is not paired with a temperature sensor 540. A plurality of heater and/or coolers 530 may be controlled in response to temperature measurements read from a single temperature sensor. This has an advantage that fewer temperature sensors are provided in the channel 200. In an embodiment, there may be a single temperature sensor 230 in the channel 200, or there may be no temperature sensor in the channel 200 under the substrate supporting area at all. In this case, the heaters and/or coolers 530 are controlled in response to readings taken from the temperatures sensors 210 and 220. In this case, the purpose of the heaters and/or coolers 530 is to smooth the temperature gradient of the heat transfer fluid in the heat transfer fluid channel 200.

In an embodiment, the heaters and/or coolers 530 are embedded in or attached to the substrate table WT. For example, the substrate table WT may have recesses and/or holes into which the heaters and/or coolers 530 are placed. Similarly, in an embodiment, the temperature sensors 540 are embedded in the substrate table WT. In an embodiment, the heaters/coolers and/or sensors are located in the substrate table WT by creating a hollow in the undersurface of the substrate table by, for example, drilling. The heaters/coolers 530 and/or sensors 540 can be sealed in situ with glue.

In an embodiment, the heaters and/or coolers 530 may thermally control just the heat transfer fluid and not the substrate table WT itself directly. For example, the heaters and/or coolers 530 may be in the fluid stream. In an embodiment, the heaters and/or coolers 530 directly contact and surround the fluid stream. For example, the heaters and/or coolers 530 may be a cylindrical heater and/or cooler. This increases the surface area of the heater and/or cooler 530 in contact with the heat transfer fluid, improving the effectiveness of thermal transfer.

In an embodiment, the temperature at sensor 210 is controlled to a substantially fixed setpoint temperature to compensate for temperature drift occurring of the incoming heat transfer fluid that is supplied to the substrate table WT. In the substrate supporting area, a thermal load would be controlled by the heaters and/or coolers 530, that load may be mostly or entirely due to, for example, immersion liquid and/or a liquid supply system 12.

Thus, by having the arrangement of heaters/coolers 530 and optionally the sensors 540 described above, the response time to the detection of thermal variation may be reduced. For example, by having heaters/coolers 530 closer to the thermal loads, the response can be quicker and the adverse effect of thermal variation on following substrates W may be avoided/greatly reduced. Further, the closer the temperature sensor 540 to the heater/cooler 530, the response time of the heater/cooler 530 will be faster, so the heater/cooler 530 will be better controllable. Having a plurality of heaters/coolers 530 may also reduce the temperature gradient (i.e., cause more uniform temperature over a surface) and have thermal control applied to where it is needed.

In an embodiment, instead of the multiple heaters and/or coolers 530, a two phase thermal control system may be provided at least under the substrate supporting area of the substrate table WT. The two phase thermal control system may use a refrigerant designed to change phase at the desired substrate table temperature (e.g., 22° C.). Such a system would have quick response time (assuming closely located temperature sensors) and be effective for local temperature variations of a surface.

In a further embodiment, a top side core heater (e.g., a thin film heater) could replace the channel 200 or be placed over the channel 200. In an embodiment, the top side heater comprises one or more metal films applied over at least the substrate supporting area and which can be controlled in a similar manner as the heaters and/or coolers 530. In an embodiment, a plurality of films may be provided, each controlling the temperature of a different region of the substrate supporting area and each being individually controllable. Such a system would have quick response time (assuming closely located temperature sensors) and be effective for local temperature variations of a surface.

In a further embodiment, the heater/cooler 240 may be the only heater/cooler to thermally control the heat transfer fluid in the channel 200, with no further heaters and/or coolers. The heat transfer fluid flow may be increased to a level such that the response time is reduced to the order of 3-5 seconds. However, physical limitations may prevent or limit the effectiveness of this solution. In an embodiment, the heater/cooler 240 is as close as possible to the substrate table WT.

Figure 12:
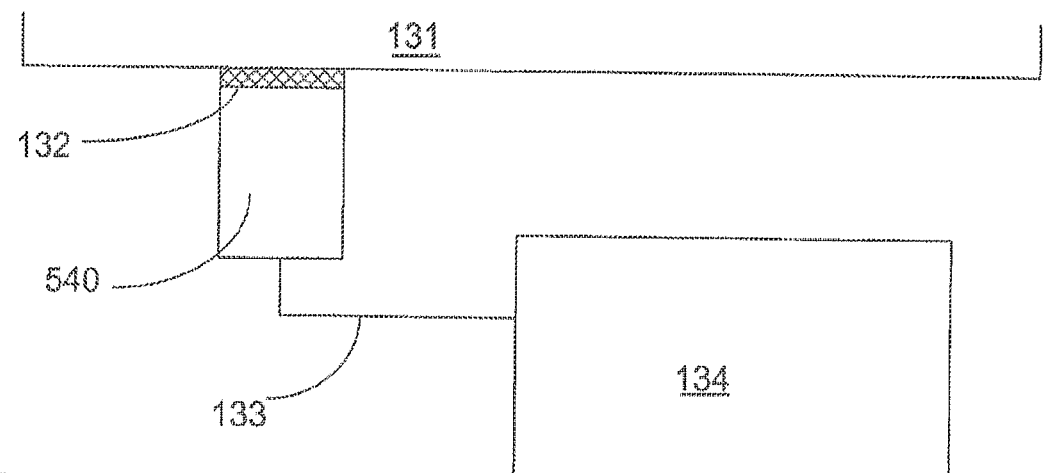
FIG. 12 illustrates a temperature sensor according to an embodiment of the invention.

FIG. 12 depicts a part of an embodiment of the invention. FIG. 12 depicts how the temperature sensor 540 may be attached to the channel 200 or to the substrate table WT. The part to which the temperature sensor 540 is attached is given the reference numeral 131. The temperature sensor 540 is configured to measure the temperature of the part 131. The part 131 may be, for example, the channel 200 or the substrate table WT.

The temperature sensor 540 may comprise a thermistor, or other thermometer equipment. According to the construction depicted in FIG. 12, the temperature sensor 540 is pressed directly against the part 131. A thermally conductive paste 132 may be provided intermediate the temperature sensor 540 and the part 131. The paste may be a heat conductive glue. The temperature sensor 540 is connected to an electrical assembly 134 via at least one wire 133. The electrical assembly 134 takes temperature readings from the temperature sensor 540. The electrical assembly 134 may be a PCB. In an embodiment, the temperature sensor 540 is mounted directly onto the electrical assembly 134 without the need of the wire 133.

A drawback of the construction depicted in FIG. 12 is that it can be difficult to position the temperature sensor 540 at the precise location where it is desired to measure the temperature. This is partly due to the presence of the electrical assembly 134 on which the temperature sensor 540 is mounted, or the presence of the wire 133 connecting the temperature sensor 540 to the electrical assembly 134. A further drawback is that the wire 133 puts pressure on the temperature sensor 540. This can undesirably affect the temperature measurement taken by the temperature sensor.

The temperature sensor 540 may be made of a semiconductor material. The temperature sensor 540 is configured to measure the temperature at a single location.

Figure 13:
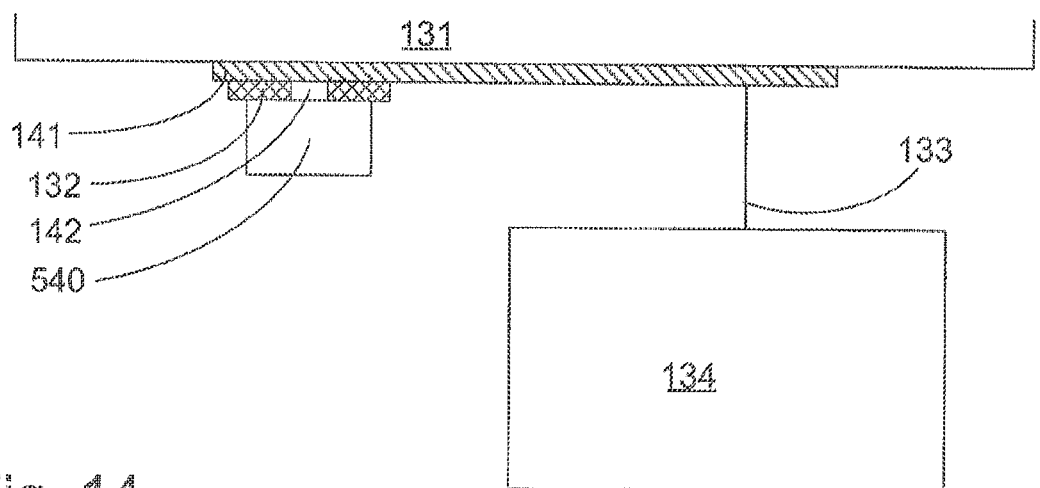
FIG. 13 illustrates a temperature sensor according to an embodiment of the invention.
Figure 14:
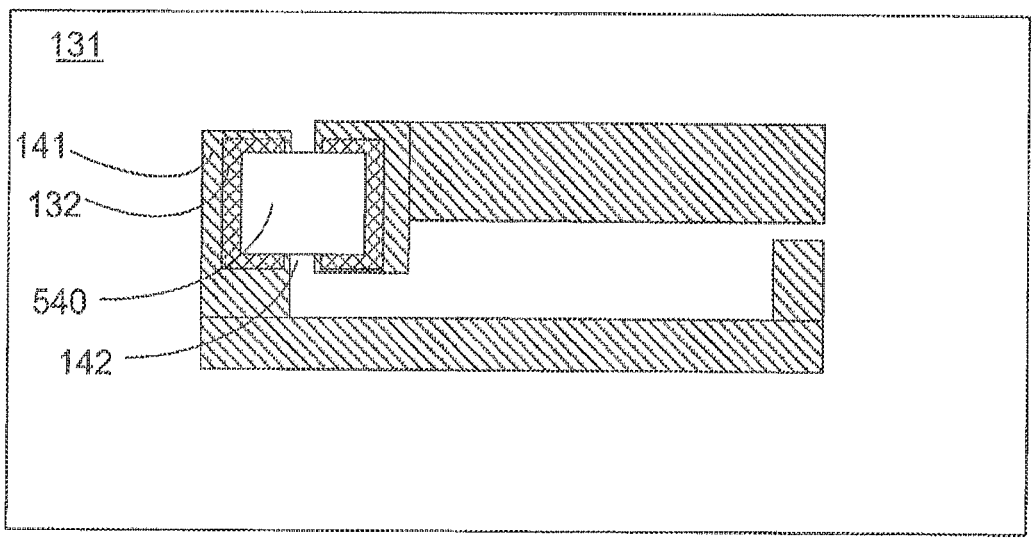
FIG. 14 illustrates, in plan, the temperature sensor of FIG. 13.

FIGS. 13 and 14 depict an alternative to the construction of FIG. 12 to attach the temperature sensor 540 to a part 131. FIG. 13 depicts a side view of the construction. FIG. 14 depicts a plan view of the construction.

The temperature sensor 540, which may be a thermistor, is attached to the part 131 at the location at which the temperature is to be measured. At this location, the part 131 is coated with an electrically conductive coating 141. Desirably, the electrically conductive coating is thermally conductive. As is most clearly seen in FIG. 14, the electrically conductive coating 141 takes the form of a pattern. The purpose of the pattern of the coating 141 is to allow the electrically conductive coating 141 to be connected to the electrical assembly 134 at an appropriate position. For example, an appropriate position may be where there is more space for the electrical assembly 134 or for the wire 133 to connect to the electrical assembly 134. For this purpose, the coating 141 may comprise at least one elongate portion.

The electrically conductive coating 141 also provides electrical shielding to the part 131 and/or to the temperature sensor 540. In this way, electrical shielding can be provided without any additional production steps. Measurement signals from the temperature sensor 540 can be read out via the electrical assembly 134, which may be connected directly to the coating 141, or indirectly via a wire 133.

The temperature sensor 540 may be attached directly to the coating 141. The temperature sensor 540 may be embedded within the coating 141. In an embodiment, the temperature sensor 540 is connected to a coating 141 via a thermally conductive adhesive (i.e. glue) 132. Desirably, the layer of glue 132 is less than 10 μm thick.

A gap 142 may be provided between the temperature sensor 540 and the coating 141. The purpose of the gap 142 is to prevent short-circuiting. The coating 141 is formed of two coating sections. Each section acts as an electrode to provide power to the temperature sensor 500 and/or receive signals from the temperature sensor 500. The gap 142 separates the two coating sections from each other. The gap 142 may be filled with an electrically insulating material.

The thickness of the coating is less than 10 μm, less than 5 μm, less than 3 μm, or less than 1 μm.

The electrically conductive coating 141 may be made of platinum, or a predominately platinum alloy, for example. The coating 141 may comprise at least one of copper, aluminum, silver and gold.

Figure 15:
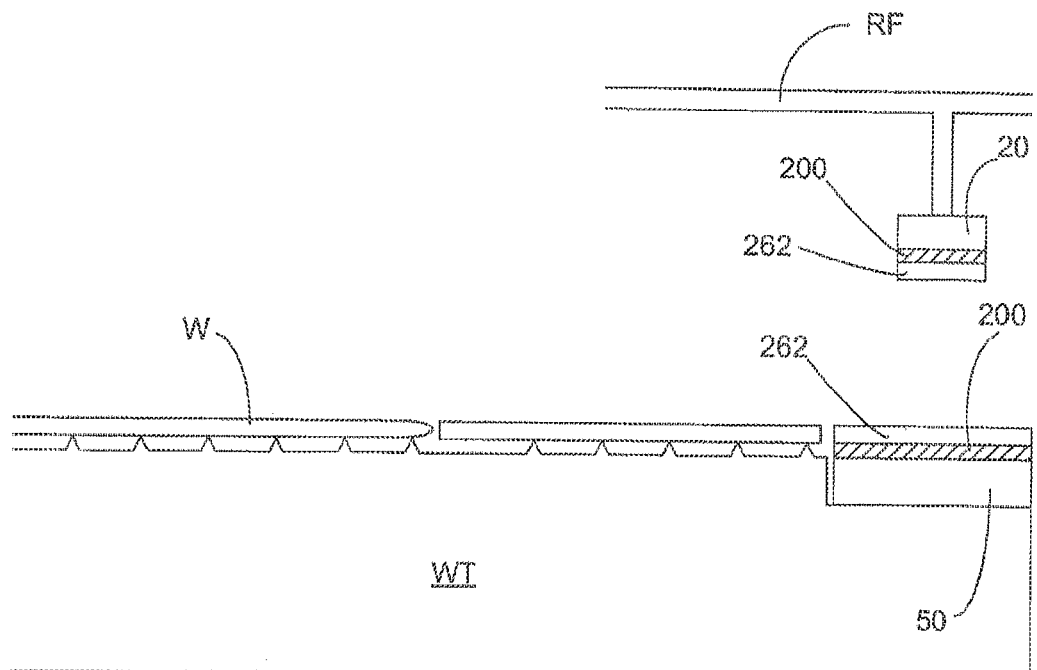
FIG. 15 is a schematic drawing, in cross-section, illustrating an embodiment of the invention.

FIG. 15 is a schematic drawing, in cross-section of an embodiment of the invention. In the above description, it has been described how a heat transfer fluid channel 200 may be employed to control the temperature of the substrate table WT, particularly under the substrate supporting area. However, the use of such a heat transfer fluid channel is not limited to the context of controlling the temperature of a substrate supporting area of a substrate table WT. Another use of such a heat transfer fluid channel 200 is depicted in FIG. 15. The heat transfer fluid channel 200 depicted in FIG. 15 is based on a similar concept to the heat transfer fluid channel 200 depicted in FIG. 11 and described above. The heat transfer fluid channel 200 depicted in FIG. 15 to control the temperature of a grating 50 or a sensor 20 on the substrate table WT may be common to the heat transfer fluid channel 200 depicted in FIG. 11 to control the temperature of the substrate supporting area. The channel 200 may be in the same chuck or support table. The channel 200 may comprise the same liquid flow system. The channel 200 may form interconnected flow systems.

FIG. 15 depicts a lithographic apparatus comprising a substrate table WT, a reference frame RF, a grating 50 and a sensor 20. The grating 50 is attached to one of the substrate table WT and reference frame RF. The sensor 20 is attached to the other of the substrate table WT and the reference frame RF. FIG. 15 depicts the case in which the grating 50 is attached to the substrate table WT and the sensor 20 is attached to the reference frame RF.

The sensor 20 is to detect radiation diffracted and/or reflected by the grating 50, so as to measure a relative position between the substrate table WT and the reference frame RF. This is a type of positional measurement device used in a lithographic apparatus in which the grating 50 and sensor 20 are mounted on different objects which are moveable relative to one another and whose relative position is desired to be measured.

As depicted in FIG. 15, the substrate table WT and/or the reference frame RF comprises a heat transfer fluid channel 200 over or under the grating 50 or sensor 20 to control thermally a surface of the grating 50 or the sensor 20. FIG. 15 depicts the case in which a heat transfer fluid channel 200 is positioned over the grating 50 attached to the substrate table WT. FIG. 15 also depicts an embodiment in which a heat transfer fluid channel 200 is positioned under the sensor 20 attached to the reference frame RF. One or more heaters and/or temperature sensors may be positioned in the channel 200 adjacent the grating 50 or sensor 20 so as to control thermally the fluid inside the channel 200. In an embodiment, one or more heaters and/or temperature sensors are not adjacent the grating 50 or sensor 20. The channel 200 may be similar to the channel depicted in FIG. 9 and described above.

A fluid of relatively high heat capacity, such as water, flows through the channel 200 adjacent the grating 50 and/or sensor 20. This stabilizes the temperature of the grating 50 or sensor 20. Stabilization of the temperature of the grating 50 or sensor 20 helps to reduce positional error that would otherwise lead to overlay error. The positional error is caused by thermal deformation of a surface of the grating 50 or sensor 20. Such thermal deformation is caused by a thermal load on the surface. A thermal load is applied to the surface if a liquid not the same temperature as the surface comes into contact with the surface. For example, the liquid may evaporate, or in any case thermally equilibrate with the surface.

This is a problem for the grating 50 as depicted in FIG. 15 because the grating 50 is located on the upper surface of the substrate table WT over which the fluid confinement structure 12 is located. The fluid confinement structure 12 may become located over all or part of the grating 50 during normal operation of the lithographic apparatus. In this case, immersion liquid can escape from the fluid confinement structure 12 and be left behind on the grating 50 as a film or as a droplet. Of course, the same problem can occur if the sensor 20 is positioned on the top surface of the substrate table WT and the grating 50 is positioned on the reference frame RF. The grating 50 may comprise a grid plate and a grating surface formed on an under side of the grid plate. The purpose of this is to prevent the grating surface itself from coming into contact with the immersion liquid. A thermal load on the grating 50 or sensor 20 can be caused by reasons other than immersion liquid on its surface. For example, a thermal load may be caused by warm gas on or adjacent the grating 50 or sensor 20.

The lithographic apparatus may further comprise an optically transparent plate 262 configured to cover at least a part of a surface of the grating 50 or the sensor 20. As depicted in FIG. 15, the plate 262 covers substantially a whole upper surface of the grating 50. The plate 262 may be made of any optically transparent material. In particular, the plate 262 may be made of a glass, or a glass-ceramic, for example.

As depicted in FIG. 15, the heat transfer fluid channel 200 may be positioned between the plate 262 and the grating 50 (or the sensor 20). As such, the fluid (e.g. water) in the channel 200 runs in the thin gap between the grating 50 and the plate 262.

The plate 262 may cover the grating 50, which is covered by heat transfer fluid, and the surface of the substrate table WT surrounding the substrate supporting area. The temperature of the heat transfer fluid can be conditioned thermally to match the temperature of the immersion liquid confined by the fluid confinement structure 12. When a droplet lands on the plate 262 above the grating 50, the heat load of the evaporating droplet is absorbed by the heat transfer fluid between the plate 262 and the grating 50. Therefore, the flow of heat transfer fluid under the plate 262 at least reduces, or possibly removes, the heat load that would otherwise be applied to the grating 50. The flow of heat transfer fluid thermally conditions the grating 50.

Although the above description has focused on the grating 50, the same advantages and mechanisms are applicable to temperature control of the sensor 20. Furthermore, the channel 200 may be positioned below the grating 50 or the sensor 20. The channel 200 may be positioned above the grating 50 or the sensor 20. The arrangement of one or more heaters and/or temperature sensors in the channel 200 may be as described above for the channel 200 depicted in FIG. 11.

The plate 262 may have a lyophobic (e.g., hydrophobic) surface. The lyophobic surface may take the form of an optically transparent coating. The coating may be as described in U.S. patent application publication no. 2009/206304. The plate 262 may be replaced easily.

The heat transfer fluid channel 200 may be connected to a separate thermal conditioning system beneath the substrate table WT. One or more thermal sensors and/or heaters, such as one or more thin film sensors and/or heaters, may be integrated into the transfer fluid channel 200. For example, such a sensor and/or heater may be integrated into a surface of the channel 200 to facilitate the thermal conditioning. The channel 200 may be integrated with a channel 200 as depicted in FIG. 9 or 11 to control the temperature of the substrate supporting area of the substrate table WT. The channel 200 for the grating and/or sensor and the channel 200 for the substrate supporting area may be connected to the same thermal conditioning system. The heater and/or temperature sensor in the channel may be one or more thin film heaters and/or temperature sensors as described with respect to FIG. 11 or in U.S. patent application No. 61/416,142.

Figure 16:
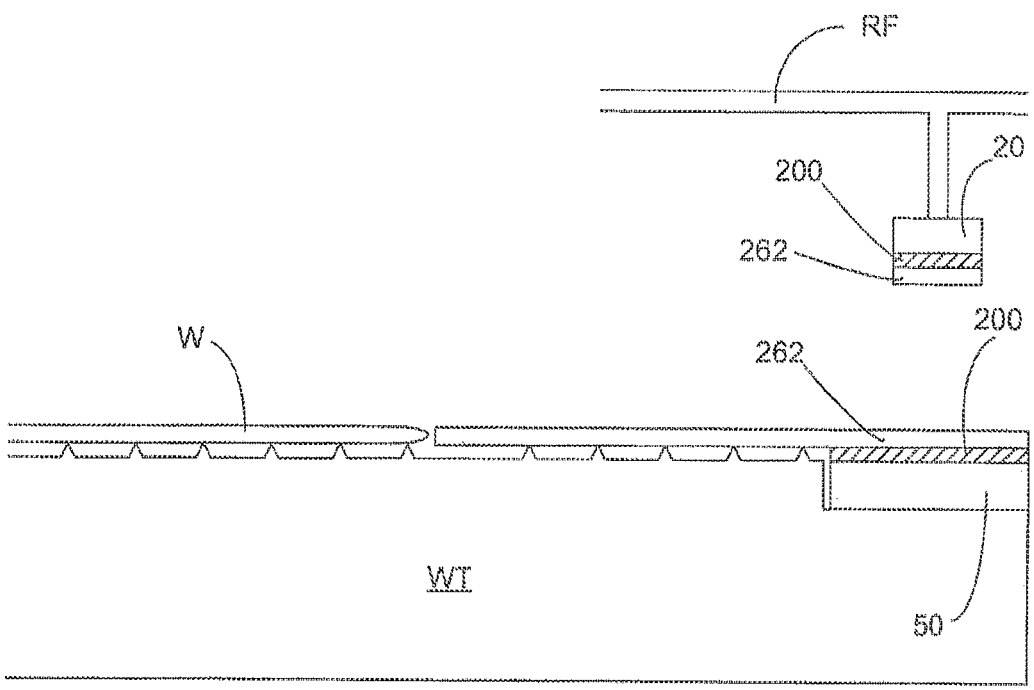
FIG. 16 is a schematic drawing, in cross-section, illustrating an embodiment of the invention.

FIG. 16 is a schematic drawing, in cross-section, of a lithographic apparatus according to an embodiment of the invention. As depicted in FIG. 16, the substrate table WT is configured to support a substrate W on a substrate supporting area. The optically transparent plate 262 is a unitary plate configured to cover an upper surface of the substrate table surrounding the substrate supporting area. Hence, a single optically transparent plate 262 may cover both the grating 50 (or sensor 20) and the surface of the substrate table WT around the substrate W. The plate 262 may be held to the substrate table WT by a vacuum. The plate 262 may be easily replaced. The plate 262 may be made of quartz. The heat transfer fluid channel 200 may be the same as described above in relation to the channel 200 depicted in FIG. 15.

Figure 17:
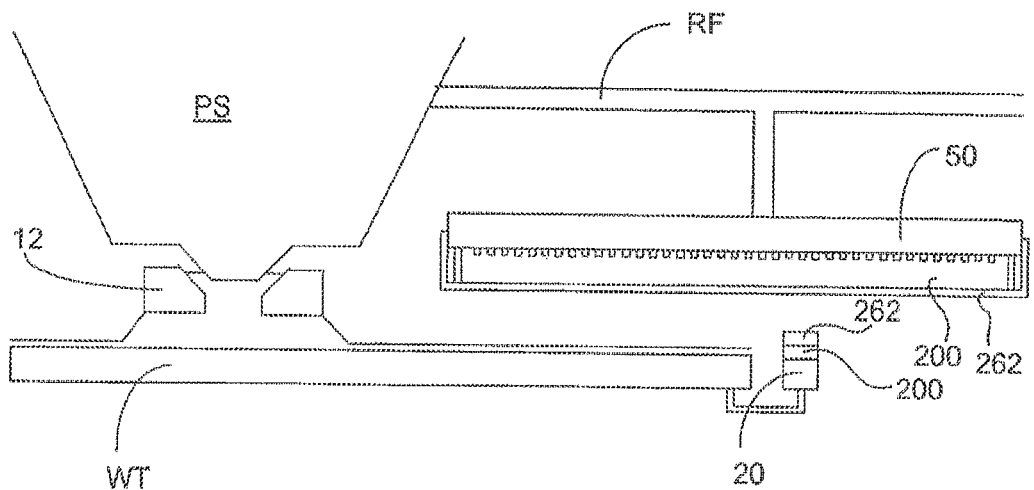
FIG. 17 is a schematic drawing, in cross-section, illustrating an embodiment of the invention.

FIG. 17 is a schematic drawing, in cross-section, of a lithography apparatus according to an embodiment of the invention. As depicted in FIG. 17, the grating 50 may be attached to the reference frame RF and the sensor 20 may be attached to the substrate table WT. In this way, the grating 50 is suspended above the substrate table WT. Such a sensor 20 and/or grating 50 may suffer from the same problem of a thermal load being applied to its surface due to a droplet landing on its surface. The sensor 20 may be positioned at the corners of the substrate table WT.

As depicted in FIG. 17, the heat transfer fluid channel 200 may be positioned below the grating 50. The channel 200 may be positioned above the sensor 20 of the substrate table WT.

Figure 18:
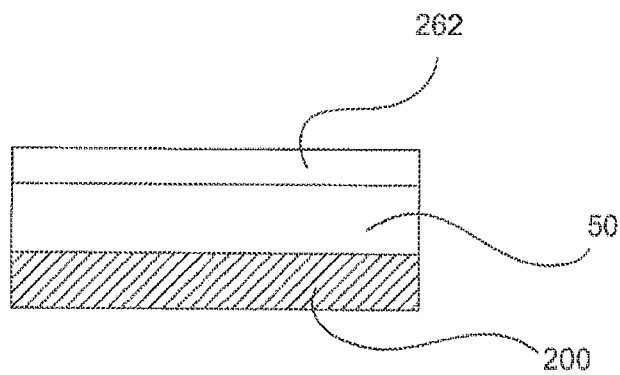
FIG. 18 depicts a variation of FIGS. 15 to 17.

FIG. 18 depicts an embodiment in which the grating 50 is positioned between the plate 262 and the heat transfer fluid channel 200. This embodiment is equally applicable to the sensor 20, in place of the grating 50. This embodiment is applicable to the context in which the grating 50 (or sensor 20) is positioned on the upper surface of the substrate table WT. In this embodiment, the heat transfer fluid can thermally condition the rear side of the grating 50. The purpose of this is that the radiation that is diffracted and/or reflected by the grating 50 and detected by the sensor 20 does not pass through the heat transfer fluid. Such control of the temperature of the grating 50 by having the heat transfer fluid channel at the rear side (i.e. the side opposite the plate 262 through which the measurement radiation passes) is equally applicable to the case in which the grating 50 or sensor 20 is attached to the reference frame RF.

Figure 19:
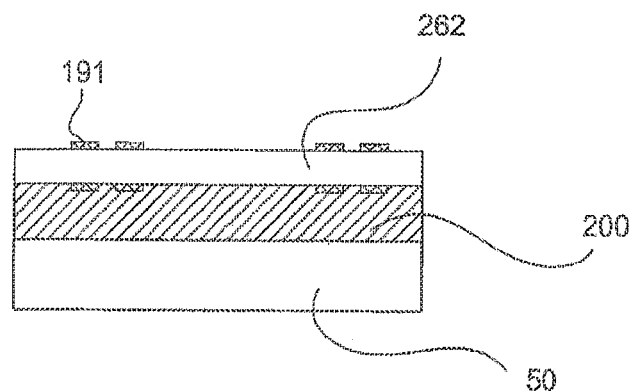
FIG. 19 is a schematic drawing, in cross-section, illustrating an optically transparent plate according to an embodiment of the invention.

FIG. 19 depicts an embodiment to compensate for irregularities in thickness of the optically transparent plate 262. The thickness of the plate 262 is desirably uniform in order to ensure optical stability and consistency at different locations of the plate 262. It can be difficult to manufacture a plate 262 with the required uniformity of thickness. Irregularity of thickness can be compensated for by use of markers 191 at a surface of the plate 262. As depicted in FIG. 19, markers 191 may be positioned at the top and or bottom (desirably both) surfaces of the plate 262. In this way, it is possible to at least partly compensate for the irregularities in the thickness of the plate 262. The markers 191 may be etched into the surface of the place 262, for example.

The temperature of the surface of the grating 50 and/or sensor 20 may be controlled by using one or more electrical heaters and/or Peltier coolers on the reverse side of the grating 50 and/or sensor 20. One or more transparent thin-film heaters may be attached to the plate 262 and/or to the grating 50. Such a thin-film heater may be positioned on either side of the plate 262 and/or grating 50.

Figure 23:
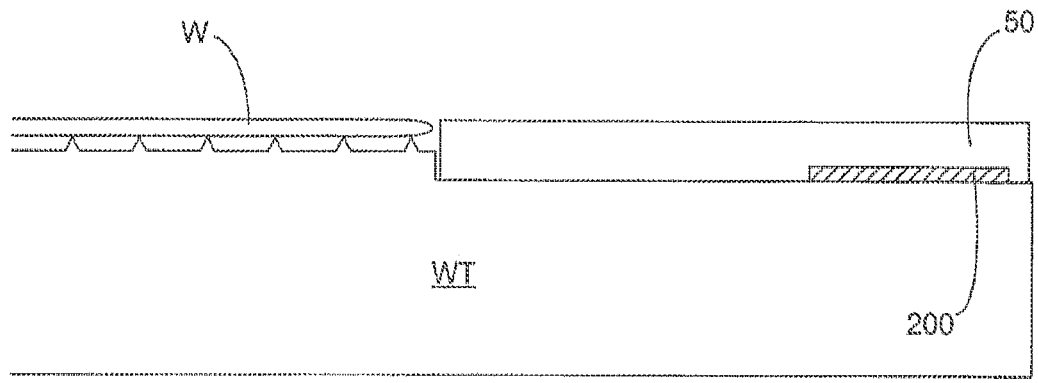
FIG. 23 is a schematic drawing, in cross-section, illustrating an embodiment of the invention.

FIG. 23 depicts an embodiment in which the grating 50 has the dimensions of the combination of the grating 50 and cover plate 262 of FIG. 16. In this case the cover plate may not comprise a part of the substrate table WT. The grating 50 comprises a plate with a grating pattern formed on one surface. The plate may perform the function of protecting the grating pattern from the immersion liquid. The grating 50 may extend from an edge of the substrate W with only a gap therebetween. The heat transfer fluid channel 200 may be arranged as described above. The channel 200 may be embedded in the grating 50.

Figure 20:
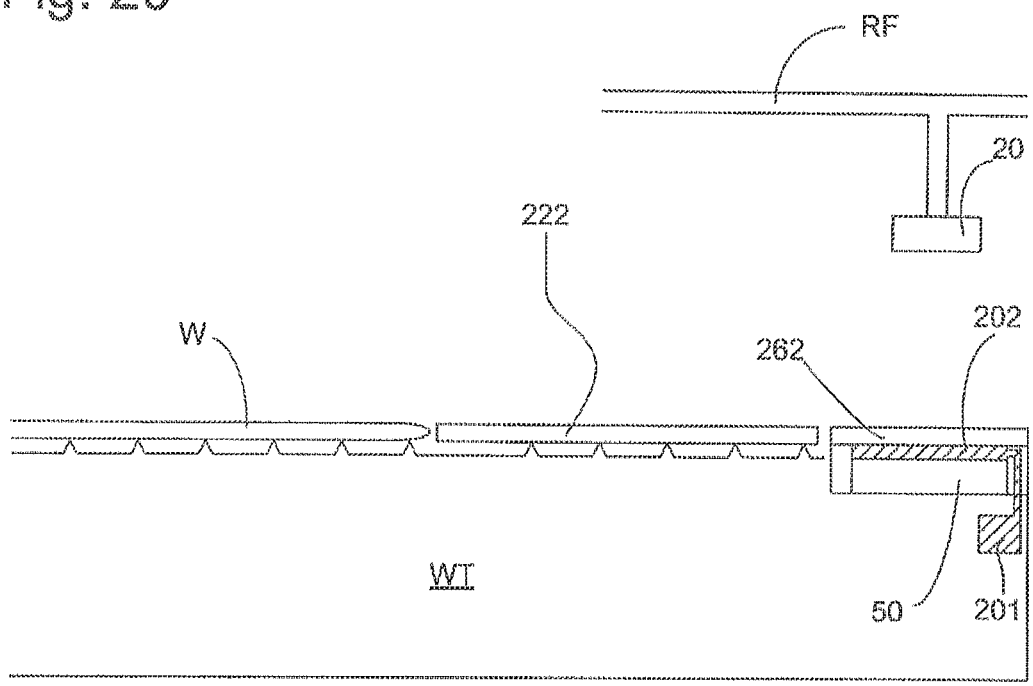
FIG. 20 is a schematic drawing, in cross-section, illustrating an embodiment of the invention.

FIG. 20 is a schematic drawing, in cross-section, of a lithographic apparatus according to an embodiment of the invention. The lithographic apparatus comprises a substrate table WT to hold a substrate W and/or a reference frame RF. A grating 50 is attached to one of the substrate table WT and the reference frame RF. The grating 50 diffracts and/or reflects radiation detected to measure a relative position between the substrate table WT and the reference frame RF. An optically transparent plate 262 is configured to cover at least a part of a surface of the grating 50. A vacuum pump 201 is configured to maintain a gap 202 between the grating 50 and the plate 262 at a pressure lower than an ambient pressure so as to hold the plate 262 in position. The vacuum pump 201 holds the plate 262 to the substrate table WT. The plate 262 does not come into contact with the grating 50. The vacuum pump 201 may be replaced by another arrangement to create a vacuum, such as a venturi.

The purpose of this is to reduce thermal conduction between the plate 262 and the grating 50. The gap 202 is evacuated between the grating 50 and the plate 262. As well as reducing the thermal conduction in the gap 202, the vacuum pump 201 is also used to clamp the plate 262. FIG. 20 depicts a grating 50 on the substrate table WT with a low-pressure region adjacent the grating 50. In an embodiment, a sensor 20 on the substrate table WT has a low-pressure region adjacent to it. The grating 50 or sensor 20 may be attached to a reference frame RF.

The plate 262 may act like a pellicle, namely a protective cover to protect against damage and dirt. This improves the robustness of the measurement with respect to contamination at the surface of the plate 262.

It is possible that under the force of the vacuum pump 201, the plate 262 will deform in shape, i.e. bow. The deformation of the plate 262 can vary slowly over time. This may adversely affect measurements made by the grating 50 and sensor 20. If the grating 50 is not level with the surface of the substrate W, then the measurements may become susceptible to Abbé acute errors. This problem may be overcome by the unitary plate 262 depicted in FIG. 16. In this case, by having a plate 262 that covers both the grating 50 and the inner part of the substrate table WT, the deformation of the plate 262 due to the force of the vacuum pump 201 is reduced. This is because the plate 262 is supported as a cantilever on its inner side. Furthermore, the unitary plate 262 that surrounds the substrate supporting area reduces the possibility of immersion liquid leaking into the gap 202.

If the unitary plate 262 of FIG. 16 is not used, then a separate inner cover 222 to cover the upper surface of the substrate table WT surrounding the substrate supporting area may be provided. As a result, there is a gap between the inner cover 222 and the plate 262. This gap can be sealed with a flexible material and/or an overlying sticker. An extractor may be provided to extract liquid from the gap between the inner cover 222 and the plate 262.

Figure 21:
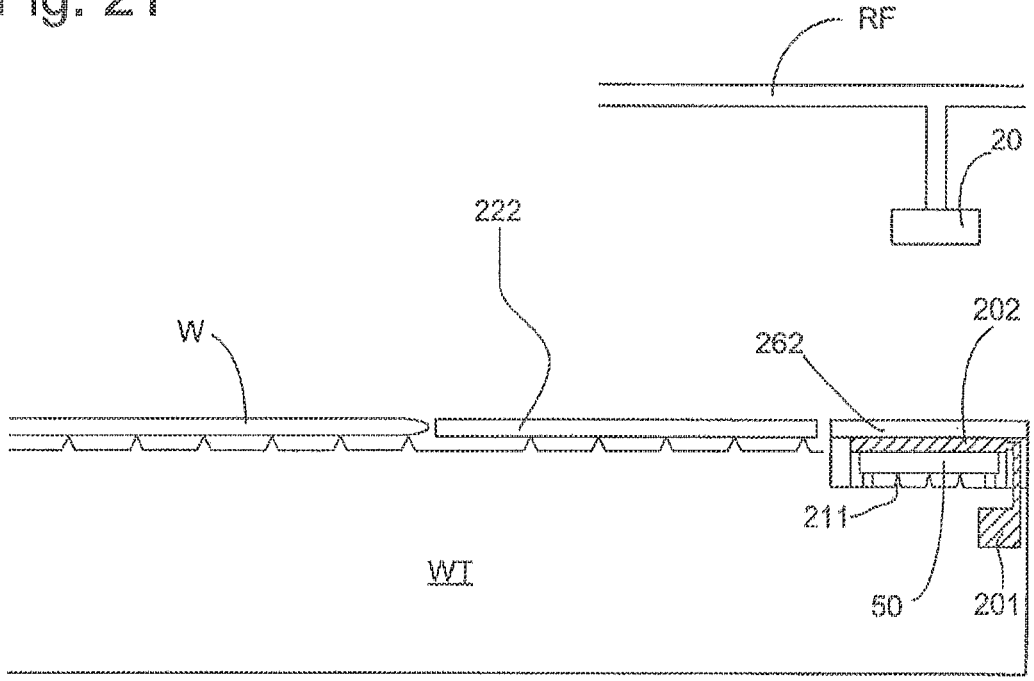
FIG. 21 is a schematic drawing, in cross-section, illustrating an embodiment of the invention.

FIG. 21 depicts, in cross-section, an embodiment of the invention. The lithographic apparatus comprises a vacuum clamp 211 configured to clamp the grating 50 to the substrate table WT or the reference frame RF. The vacuum pump 201 is configured to maintain the gap 202 between the grating 50 and the plate 262 at a pressure higher than the pressure between the grating 50 and the substrate table WT or reference frame RF. The purpose of this is to reliably hold the grating 50 to the substrate table WT (or reference frame RF). The gap 202 may be maintained at a partial vacuum.

Figure 22:
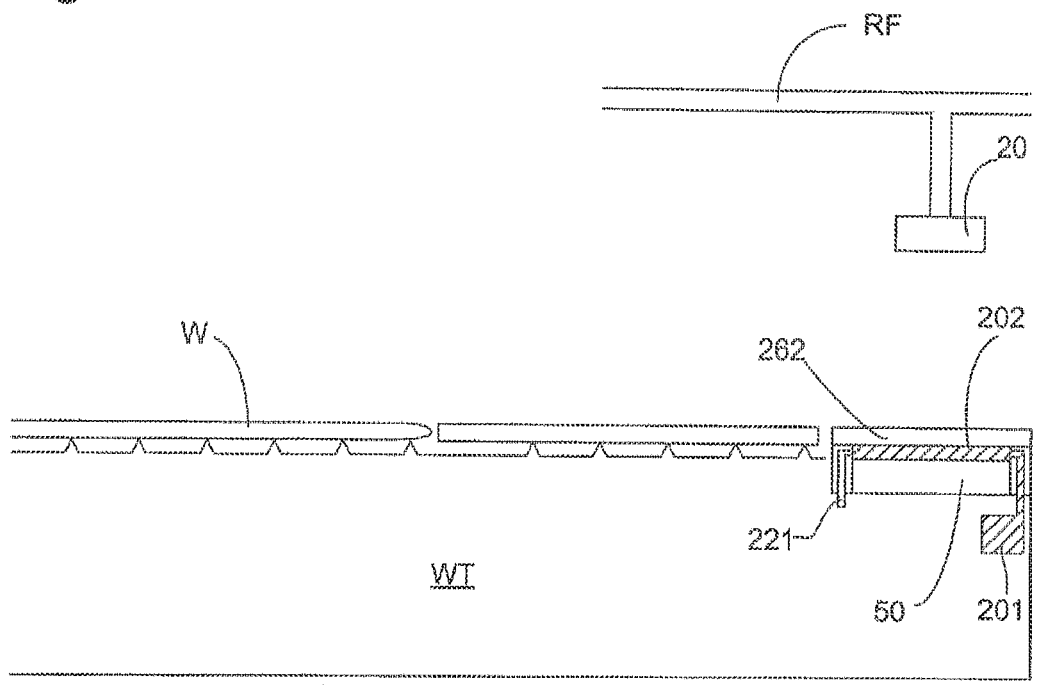
FIG. 22 is a schematic drawing, in cross-section, illustrating an embodiment of the invention.

FIG. 22 depicts, in cross-section, a variation of an embodiment of the invention. As depicted in FIG. 22, there is a purge opening 221 configured to supply a flow of gas into the gap 202 between the grating 50 and the plate 262. The purpose of this is to remove particles trapped in the gap 202. Such particles may be trapped in the gap 202 particularly during assembly of the apparatus. Clean gas can flow over the surface of the grating 50. This gas may be removed via a tube used by the vacuum pump 201. Hence, contaminants can be removed with a flow of clean gas over the surface of the grating 50.

FIGS. 21 and 22 depict a grating 50 on the substrate table WT with a low-pressure region adjacent the grating 50. In an embodiment, a sensor 20 on the substrate table WT has a low-pressure region adjacent to it. The grating 50 or sensor 20 may be attached to a reference frame RF.

An embodiment of the invention results in improved overlay performance of the lithographic apparatus. This is because evaporative cooling of the immersion liquid will have a reduced cooling effect on the grating 50 and/or sensor 20 and will therefore deform the grating 50 and/or sensor 20 to a lesser extent. An embodiment of the present invention provides easier maintenance of the apparatus. This is because when the lyophobic coating of the plate 262 degrades, then the whole plate 262 can be replaced.

Although an embodiment of the present invention has been described above with reference to an immersion lithographic apparatus, this need not necessarily be the case. Other types of lithographic apparatus may suffer from uneven cooling (or heating) around the edge of a substrate. For example, in an EUV apparatus (extreme ultra-violet apparatus) heating due to the impingement of the projection beam can occur. This can give a localized heating to the substrate rather in the same way as the passage of the edge of a substrate under the localized liquid supply system can give a cooling effect. If the heat transfer fluid in the channel 200 is given a small negative temperature offset with respect to the desired temperature in a normal operating condition, all the heaters can be on to obtain the desired temperature. A local cooling load can then be applied by switching a heater off. In this circumstance it may be that the localization of the heaters only at the edge of the substrate is too limited and that heaters may be additionally or alternatively be placed at different radial distances from the center of the substrate supporting area. However, the same principles as described above apply in this case also.

Therefore, as can be seen, an embodiment of the present invention can be implemented in many types of immersion lithographic apparatus. For example, an embodiment of the invention may be implemented in an I-line lithographic apparatus.

In an embodiment, there is provided a substrate table to support a substrate on a substrate supporting area, the substrate table comprising a heat transfer fluid channel under at least a part of the substrate supporting area, and at least one heater and/or cooler at a location under the substrate supporting area to control thermally the heat transfer fluid in the channel. In an embodiment, the substrate table comprises a plurality of heaters and/or coolers at locations under the substrate supporting area to control thermally the heat transfer fluid in the channel. In an embodiment, each of the plurality of heaters and/or coolers are individually controllable. In an embodiment, the substrate table further comprises a thermal control element extending around at least part of a periphery of the substrate supporting area. In an embodiment, the thermal control element comprises a plurality of thermal control elements extending around the periphery of the substrate supporting area. In an embodiment, the substrate table further comprises a plurality of thermal control element temperature sensors, each of the thermal control elements being associated with at least one of the plurality of thermal control element temperature sensors. In an embodiment, the substrate table further comprises a plurality of channel temperature sensors, each of the heaters and/or coolers being associated with at least one of the plurality of channel temperature sensors. In an embodiment, a plurality of the plurality of channel temperature sensors are at locations under the substrate supporting area. In an embodiment, each associated channel temperature sensor is downstream of its associated heater and/or cooler. In an embodiment, at least one of the plurality of temperature sensors is embedded in material of the substrate table. In an embodiment, at least one of the channel temperature sensors is connected to an electrical assembly to read measurements from the channel temperature sensor indirectly via an electrically conductive coating on the component to which the channel temperature sensor is applied. In an embodiment, the substrate table further comprises a controller configured to control power provided to the at least one heater and/or cooler based on feedback based on a temperature measured by a temperature sensor. In an embodiment, the substrate table further comprises a controller configured to control power provided to the at least one heater and/or cooler based on feedforward control. In an embodiment, there is provided an immersion lithographic projection apparatus comprising the substrate table described herein. In an embodiment, the immersion lithographic apparatus further comprises a liquid handling system configured to provide a liquid to a localized area of the top surface of the substrate table and/or substrate.

In an embodiment, there is provided a method of compensating for a local heat load in a lithographic projection apparatus comprising a substrate table configured to support a substrate on a substrate supporting area, the method comprising: controlling at least one heater and/or cooler at a location under the substrate supporting area to control thermally a heat transfer fluid in a heat transfer fluid channel under at least a part of the substrate supporting area.

In an embodiment, there is provided a lithographic apparatus comprising: a substrate table to hold a substrate; a reference frame; a grating attached to one of the substrate table and reference frame; and a sensor attached to the other of the substrate table and reference frame, the sensor configured to detecting radiation diffracted and/or reflected by the grating so as to measure a relative position between the substrate table and the reference frame, wherein the substrate table and/or the reference frame comprises a heat transfer fluid channel over or under the grating and/or sensor to control thermally the grating and/or sensor.

In an embodiment, the lithographic apparatus further comprises an optically transparent plate configured to cover at least a part of a surface of the grating and/or sensor. In an embodiment, the channel is positioned between the plate and the grating and/or sensor. In an embodiment, the grating and/or sensor is positioned between the plate and the channel. In an embodiment, the substrate table is configured to support a substrate on a substrate supporting area; and the plate is a unitary plate configured to cover an upper surface of the substrate table surrounding the substrate supporting area. In an embodiment, the lithographic apparatus further comprises a vacuum clamp configured to hold the plate and the substrate table together. In an embodiment, the plate comprises a marker etched into its surface so as to compensate for irregularity in thickness of the plate.

In an embodiment, there is provided a lithographic apparatus comprising: a reference frame and/or a substrate table to hold a substrate; a grating attached to the substrate table or the reference frame, wherein the grating is configured to diffract and/or reflect radiation detected to measure a relative position between the substrate table and the reference frame; an optically transparent plate configured to cover at least a part of a surface of the grating; and a vacuum pump configured to maintain a gap between the grating and the plate at a pressure lower than an ambient pressure so as to hold the plate in position.

In an embodiment, the lithographic apparatus further comprises a vacuum clamp configured to clamp the grating to the substrate table or the reference frame, wherein the vacuum pump is configured to maintain the gap between the grating and the plate at a pressure higher than a pressure between the grating and the substrate table or the reference frame.

In an embodiment, the substrate table is configured to support a substrate on a substrate supporting area; and the plate is a unitary plate configured to cover an upper surface of the substrate table surrounding the substrate supporting area. In an embodiment, the lithographic apparatus further comprises a purge opening configured to supply a flow of gas into the gap between the grating and the plate so as to remove particles trapped in the gap.

In an embodiment, there is provided a lithographic apparatus comprising: a substrate table to hold a substrate on a substrate supporting area; and a grating or sensor attached to the substrate table, wherein the grating or sensor is a part of a positional system, wherein the substrate table comprises a heat transfer fluid channel under the substrate supporting area and adjacent the grating or sensor, so as to control thermally the temperature of the substrate supporting area and the grating or sensor.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of or about 365, 248, 193, 157 or 126 nm).

The term "lens", where the context allows, may refer to any one or combination of various types of optical components, including refractive and reflective optical components.

While specific embodiments of the invention have been described above, it will be appreciated that the invention may be practiced otherwise than as described. For example, the embodiments of the invention may take the form of a computer program containing one or more sequences of machine-readable instructions describing a method as disclosed above, or a data storage medium (e.g. semiconductor memory, magnetic or optical disk) having such a computer program stored therein. Further, the machine readable instruction may be embodied in two or more computer programs. The two or more computer programs may be stored on one or more different memories and/or data storage media.

The controllers described above may have any suitable configuration for receiving, processing, and sending signals. For example, each controller may include one or more processors for executing the computer programs that include machine-readable instructions for the methods described above. The controllers may also include data storage medium for storing such computer programs, and/or hardware to receive such medium.

One or more embodiments of the invention may be applied to any immersion lithography apparatus, in particular, but not exclusively, those types mentioned above, whether the immersion liquid is provided in the form of a bath, only on a localized surface area of the substrate, or is unconfined on the substrate and/or substrate table. In an unconfined arrangement, the immersion liquid may flow over the surface of the substrate and/or substrate table so that substantially the entire uncovered surface of the substrate table and/or substrate is wetted. In such an unconfined immersion system, the liquid supply system may not confine the immersion liquid or it may provide a proportion of immersion liquid confinement, but not substantially complete confinement of the immersion liquid.

A liquid supply system as contemplated herein should be broadly construed. In certain embodiments, it may be a mechanism or combination of structures that provides a liquid to a space between the projection system and the substrate and/or substrate table. It may comprise a combination of one or more structures, one or more liquid inlets, one or more gas inlets, one or more gas outlets, and/or one or more liquid outlets that provide liquid to the space. In an embodiment, a surface of the space may be a portion of the substrate and/or substrate table, or a surface of the space may completely cover a surface of the substrate and/or substrate table, or the space may envelop the substrate and/or substrate table. The liquid supply system may optionally further include one or more elements to control the position, quantity, quality, shape, flow rate or any other features of the liquid.

The descriptions above are intended to be illustrative, not limiting. Thus, it will be apparent to one skilled in the art that modifications may be made to the invention as described without departing from the scope of the claims set out below.

The invention claimed is:

1. A substrate table for a lithographic apparatus, the substrate table comprising:
   a substrate supporting area;
   either a sensor configured to detect radiation diffracted and/or reflected by a grating so as to measure a relative position between the grating and the sensor or the grating, wherein the grating or sensor is outward of the substrate supporting area, wherein the sensor or grating on the substrate table is supported by a plurality of protrusions on a top surface of the substrate table;
   a plate having at least a portion thereof located between the substrate supporting area and the grating or sensor, the plate forming a gap with a substrate, when the substrate is supported on the substrate supporting area;
   a plurality of heaters provided at the substrate supporting area, each heater configured to control a temperature of a different region of the substrate supporting area and each being individually controllable;
   a plurality of temperature sensors, each temperature sensor configured to measure a temperature of a part of the substrate table; and
   an inlet adjacent to the gap, the inlet configured to remove a fluid comprising liquid.

2. The substrate table of claim 1, wherein a gap is located between the plate and the sensor or grating and further comprising an extractor configured to remove liquid entering the gap between the plate and the sensor or grating.

3. The substrate table of claim 1, comprising the grating and further comprising an outlet configured to apply a low pressure between the grating and a portion of the substrate table.

4. The substrate table of claim 3, wherein the outlet is configured to apply the low pressure to the grating to releasably attract the grating to the table.

5. The substrate table of claim 1, comprising an optically transparent structure that covers the sensor or grating on the substrate table.

6. The substrate table of claim 1, further comprising a heater or Peltier device, separate from the plurality of heaters, to thermally control the sensor or grating on the substrate table.

7. The substrate table of claim 1, wherein the sensor or grating is supported in a recess of the substrate table.

8. The substrate table of claim 1, wherein the plate is removably attached to the substrate table and further comprising an outlet configured to apply a low pressure between the plate and a portion of the substrate table.

9. A lithographic apparatus comprising:
   a projection system configured to project a radiation beam onto a substrate; and
   the substrate table of claim 1.

10. A substrate table for a lithographic apparatus, the substrate table comprising:
    a substrate supporting area;
    either a sensor configured to detect radiation diffracted and/or reflected by a grating so as to measure a relative position between the grating and the sensor or the grating, wherein the grating or sensor is outward of the substrate supporting area;
    a structure having at least a portion thereof located between the substrate supporting area and the grating or sensor, the structure having an upper surface arranged to be essentially co-planar with an upper surface of the substrate, when supported on the substrate supporting area, and essentially co-planar with an upper surface of the sensor or grating, wherein the structure is spaced apart from the substrate, when supported on the substrate table, in a horizontal direction by the gap and spaced apart in the horizontal direction from the sensor or grating by a further gap;
    a plurality of heaters, each heater configured to control a temperature of a different region of or at the substrate supporting area and each being individually controllable;
    a plurality of temperature sensors, each temperature sensor configured to measure a temperature of a part of the substrate table; and
    an inlet to remove a fluid comprising liquid entering into a gap between the substrate and the substrate table.

11. The substrate table of claim 10, comprising the sensor.

12. The substrate table of claim 10, further comprising an extractor configured to remove liquid entering the further gap between the structure and the sensor grating.

13. A lithographic apparatus comprising:
    a projection system configured to project a radiation beam onto a substrate; and
    the substrate table of claim 10.

14. The substrate table of claim 10, comprising the sensor and the sensor is mounted on a bracket protruding from a body of the substrate table.

15. A substrate table for a lithographic apparatus, the substrate table comprising:
    a substrate supporting area;
    either a sensor configured to detect radiation diffracted and/or reflected by a grating so as to measure a relative position between the grating and the sensor or the grating, wherein the grating or sensor is horizontally outward of the substrate supporting area;
    a structure having at least a portion thereof located horizontally outward from the substrate supporting area and horizontally inward of the grating or sensor, the structure forming a horizontal gap with a substrate, when the substrate is supported on the substrate supporting area, wherein the structure is spaced apart from the substrate, when supported on the substrate table, in a horizontal direction by the gap and spaced apart in the horizontal direction from the sensor or grating by a further gap;
    a plurality of heaters, each heater configured to control a temperature of a different region of or at the substrate supporting area and each being individually controllable;
    a plurality of temperature sensors, each temperature sensor configured to measure a temperature of a part of the substrate table; and an inlet adjacent to the gap, the inlet configured to remove a fluid comprising liquid.

16. The substrate table of claim 15, comprising the sensor.

17. The substrate table of claim 15, comprising the grating and further comprising an outlet configured to apply a low pressure between the grating and a portion of the substrate table.

18. The substrate table of claim 15, wherein the structure is removably attached to the substrate table and further comprising an outlet configured to apply a low pressure between the structure and a portion of the substrate table.

19. A lithographic apparatus comprising:
   a projection system configured to project a radiation beam onto a substrate; and
   the substrate table of claim 15.

20. The substrate table of claim 15, comprising the sensor and the sensor is mounted on a bracket protruding from a body of the substrate table.

\* \* \* \* \*